United States Patent
Kando et al.

(10) Patent No.: US 8,390,400 B2
(45) Date of Patent: Mar. 5, 2013

(54) ACOUSTIC WAVE ELEMENT HAVING AN ELECTRODE FINGER WITH A PROTRUSION

(75) Inventors: Hajime Kando, Ritto (JP); Shunsuke Kido, Kusatsu (JP); Takeshi Nakao, Omihachiman (JP); Daisuke Yamamoto, Muko (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 203 days.

(21) Appl. No.: 12/542,733

(22) Filed: Aug. 18, 2009

(65) Prior Publication Data

US 2009/0295507 A1 Dec. 3, 2009

Related U.S. Application Data

(63) Continuation of application No. PCT/JP2008/054591, filed on Mar. 13, 2008.

(30) Foreign Application Priority Data

Mar. 27, 2007 (JP) ................................ 2007-082350

(51) Int. Cl.
 *H03H 9/64* (2006.01)
(52) U.S. Cl. .................. 333/193; 333/196; 310/313 B; 310/313 C
(58) Field of Classification Search .......... 333/193–196; 310/313 B, 313 C
See application file for complete search history.

(56) References Cited

U.S. PATENT DOCUMENTS

| 6,791,236 B1 * | 9/2004 | Abramov .................. 310/313 B |
| 7,501,916 B2 | 3/2009 | Kando |
| 7,576,471 B1 * | 8/2009 | Solal .......................... 310/313 B |
| 2007/0296528 A1 | 12/2007 | Kando |
| 2008/0266027 A1 * | 10/2008 | Yata .............................. 333/195 |

FOREIGN PATENT DOCUMENTS

JP 57-97215 * 6/1982 .................... 333/196

(Continued)

OTHER PUBLICATIONS

Official Communication issued in corresponding Chinese Patent Application No. 200880003074.3, mailed on Mar. 29, 2011.

(Continued)

*Primary Examiner* — Barbara Summons
(74) *Attorney, Agent, or Firm* — Keating & Bennett, LLP

(57) ABSTRACT

An acoustic wave element includes an IDT electrode in contact with a piezoelectric material and including a plurality of electrode fingers, which include first and second electrode fingers that adjoin each other in an acoustic wave propagation direction and that connect to different potentials and a first dummy electrode finger facing the first electrode finger via a gap located on an outer side in an electrode finger length direction of the first electrode finger. At an area near the gap, first protrusions are provided in at least one of the first electrode finger and the first dummy electrode finger, the first protrusion protruding in the acoustic wave propagation direction from at least one of side edges of the at least one of the first electrode finger and the first dummy electrode finger. The acoustic wave element has greatly improved resonance characteristics of a resonance frequency and prevents short-circuit failure between electrode fingers and degradation in insulation properties.

17 Claims, 17 Drawing Sheets

FOREIGN PATENT DOCUMENTS

| | | | | |
|---|---|---|---|---|
| JP | 62-286305 | * | 12/1987 | .................. 333/193 |
| JP | 6-164297 A | | 6/1994 | |
| JP | 6-350383 | * | 12/1994 | |
| JP | 2000-183681 A | | 6/2000 | |
| JP | 2004-343259 A | | 12/2004 | |
| JP | 2006-186435 A | | 7/2006 | |
| JP | 2008-35220 | * | 2/2008 | |
| WO | 2006/109591 A1 | | 10/2006 | |

OTHER PUBLICATIONS

Official communication issued in the International Application No. PCT/JP2008/054591, mailed on Jun. 17, 2008.

Official Communication issued in corresponding Japanese Patent Application No. 2009-509009, mailed on Sep. 27, 2011.

Official Communication issued in corresponding Chinese Patent Application No. 200880003074.3, mailed on Jan. 29, 2012.

* cited by examiner

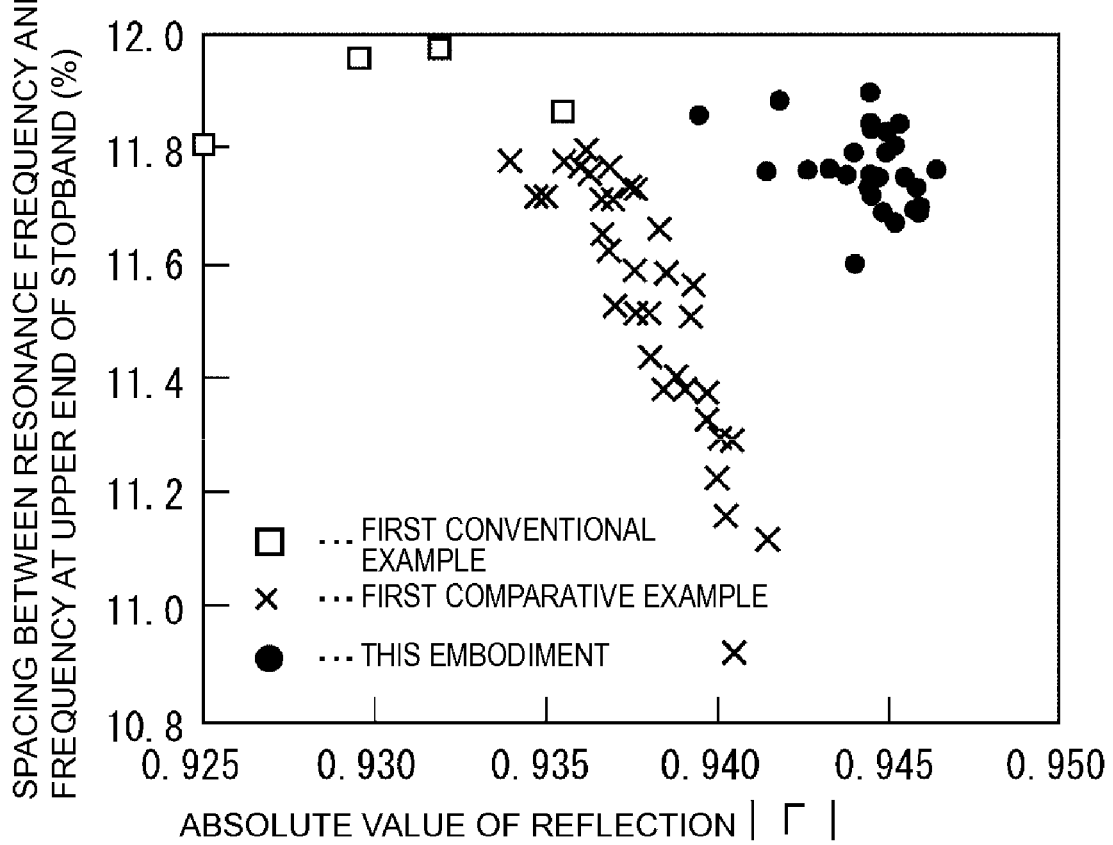

ACOUSTIC WAVE ELEMENT HAVING AN ELECTRODE FINGER WITH A PROTRUSION

BACKGROUND OF THE INVENTION

1. Field of the Invention

The present invention relates to acoustic wave elements used in resonators, bandpass filters, and the like. Particularly, the present invention relates to an acoustic wave element having an improved structure of an IDT electrode including a plurality of electrode fingers.

2. Description of the Related Art

Acoustic wave elements have been widely used in resonators and bandpass filters. As the acoustic wave elements, surface acoustic wave (SAW) elements utilizing surface acoustic waves and boundary acoustic wave (BAW) elements utilizing boundary acoustic waves are known.

In the acoustic wave elements such as the BAW elements and the SAW elements, an IDT electrode including a plurality of electrode fingers is used to excite acoustic waves. By applying crossing width weighting to the IDT electrode, filter characteristics and resonance characteristics are improved. However, even when a weighted IDT electrode is used, it has been difficult to obtain sufficient resonance characteristics and filter characteristics.

WO2006/109591 discloses an acoustic wave element having an improved shape of an IDT electrode to further improve resonance characteristics and filter characteristics.

FIG. 28 is a schematic partial plan view illustrating a main portion of an IDT electrode of the acoustic wave element described in WO2006/109591. As illustrated in FIG. 28, in an IDT electrode 1000, a plurality of electrode fingers 1001 connected to one potential and a plurality of electrode fingers 1002 connected to the other potential are alternately arranged in an acoustic wave propagation direction.

In the portion illustrated in FIG. 28, a dummy electrode finger 1004 is located at the end of the first electrode finger 1001 via a gap 1003 in an electrode finger length direction. A protrusion 1005 is formed on a side edge of the second electrode finger 1002. The protrusion 1005 is located at a position substantially equal to the position of the gap 1003 along the electrode finger length direction on one of the side edges of the second electrode finger 1002. In the portion where the gap 1003 exists, a dimension in the width direction along the acoustic wave propagation direction of a region with no electrode is small in accordance with the protrusion 1005. This structure reduces the difference in behavior between acoustic waves passing the gap 1003 and acoustic waves propagating in a portion where the gap 1003 does not exist, whereby the resonance characteristics and filter characteristics are improved.

Also, in the IDT electrode 1000, the end of the first electrode finger 1001, i.e., a side end portion of the gap 1003, and the end of the dummy electrode finger 1004, i.e., the end portion on the gap 1003 side, have tapered portions 1001a and 1004a, respectively, which taper down toward the ends. Providing the tapered portions 1001a and 1004a causes a gradual change in propagation environment of acoustic waves from the side of the gap 1003 toward the opposite side in the portions provided with the tapered portions 1001a and 1004a. This change also improves the resonance characteristics and filter characteristics.

As described above, in the acoustic wave element including the IDT electrode 1000 described in WO2006/109591, the resonance characteristics and filter characteristics are improved to some extent due to the devised shape of the IDT electrode compared to a conventional acoustic wave element.

However, the improvement is insufficient. That is, a further improvement of the resonance characteristics and filter characteristics is intensively demanded.

In the structure described in WO2006/109591, when the protrusion 1005 is larger and when the tapered portions 1001a and 1004a are larger, the portion touches an adjoining electrode finger connected to the other potential, which causes problems of short circuit and degradation in insulation properties.

Furthermore, the characteristic at the vicinity of a resonance point heavily depends on the shape of the IDT electrode. Therefore, the above-described shape disadvantageously causes variations in the shape of the electrode fingers during manufacturing, leading to variations in resonance characteristics and filter characteristics. In addition, when the size of the protrusion 1005 is increased to enhance the resonance characteristics and filter characteristics, a stopband becomes narrow disadvantageously.

SUMMARY OF THE INVENTION

In view of the above, preferred embodiments of the present invention provide an acoustic wave element that achieves a further improvement in resonance characteristics and filter characteristics and that prevents short circuit, degradation of insulation properties, and variations in characteristic, by devising the shape of an IDT electrode.

According to a preferred embodiment of the present invention, there is provided an acoustic wave element including a piezoelectric material and at least one IDT electrode that is in contact with the piezoelectric material. The at least one IDT electrode includes a plurality of electrode fingers including first and second electrode fingers that adjoin each other in an acoustic wave propagation direction and that connect to different potentials and a first dummy electrode finger that faces the first electrode finger via a gap placed on an outer side in an electrode finger length direction of an end of the first electrode finger and that connects to the same potential as the potential connected to the second electrode finger. In an area near the gap, a first protrusion is provided in at least one of the first electrode finger and the first dummy electrode finger, the first protrusion protruding in the acoustic wave propagation direction from at least one of side edges of the electrode finger.

In a specific aspect of the acoustic wave element according to a preferred embodiment of the present invention, the first protrusion is arranged to be in contact with the gap. In this case, at the vicinity of the gap provided on the outer side of the end of the at least one of the first electrode finger and the first dummy electrode finger, reflection and scattering of acoustic waves due to a mismatch of acoustic impedance are reliably prevented. Accordingly, filter characteristics and resonance characteristics are greatly improved.

The first protrusion may be separated from the gap. In another specific aspect according to a preferred embodiment of the present invention, the first protrusion is separated from the gap, and a tapered portion is provided between the first protrusion and the gap. A width of the at least one of the first electrode finger and the first dummy electrode finger provided with the first protrusion is smaller at the end in the tapered portion. In this case, degradation in characteristics due to diffraction in the gap can be compensated for, whereby the filter characteristics and the resonance characteristic can be further improved.

In the acoustic wave element according to a preferred embodiment of the present invention, when the first protrusion and the first tapered portion are provided, a side edge portion of the electrode finger extending from the first protrusion to the tapered portion may have a concave shape or a convex shape.

Preferably, in the acoustic wave element according to a preferred embodiment of the present invention, when the side edge portion extending from the first protrusion to the tapered portion at the end of the electrode finger has a concave or concave shape, the side edge portion is curved. Thus, variations in shape rarely occur during manufacturing of the electrode fingers. That is, variations in characteristic due to variations in shape rarely occur. In addition, even when the size of the gap is small, i.e., even when the dimension of the gap along the electrode finger length direction is small, short-circuits failure rarely occur. A second protrusion protruding in the acoustic wave propagation direction is preferably formed on a side edge of at least one of the first and second electrode fingers, the second protrusion being positioned in a range provided with the gap in the electrode finger length direction. In this case, since the second protrusion is provided, a phase shift between acoustic waves in the gap and acoustic waves propagating in a portion other than the gap can be compensated for. Accordingly, the filter characteristics and the resonance characteristic can be further improved.

Particularly, since the first protrusion is also provided, an effects of the first protrusion and the effects of the second protrusion enable a further enhancement of the filter characteristics and the resonance characteristics without narrowing a stopband.

Preferably, in the acoustic wave element according to a preferred embodiment of the present invention, the second protrusion is arranged so that an effective propagation distance of surface waves propagating through the gap in a portion where the first and second electrode fingers are located and an effective propagation distance of acoustic waves propagating in a portion other than the gap and the first protrusion in the portion where the first and second electrode fingers are provided are substantially equal to each other.

Preferably, in a preferred embodiment of the present invention, the second protrusion protrudes from a side edge on the side facing the gap of one of the first and second electrode fingers toward the gap provided at an end of the other of the first and second electrode fingers. In this case, since the second protrusion is provided, a difference in length of a portion without an electrode in a boundary acoustic wave propagation path between the portion provided with the gap and a position separated from the gap in the electrode finger direction is small. Accordingly, the resonance characteristics and the filter characteristics can be further improved.

Preferably, the first and second protrusions have a trapezoid shape in plan view, a lower base of the trapezoid is a portion of a side edge of the electrode finger provided with the protrusion, and an inner angle formed by the lower base and a side edge connecting an upper base and the lower base of the trapezoid is less than about 90°. In this case, acoustic impedance can be gradually changed, and thus undesired reflection and scattering of acoustic waves can be further prevented. Accordingly, the resonance characteristics and the filter characteristics can be further improved.

More preferably, a position in the electrode finger length direction of a midpoint of the lower base of the second protrusion is substantially equal to a center position in the electrode finger length direction of the gap at the end of the other electrode finger, a length of the lower base is larger than a gap width which is a dimension along the electrode finger length direction of the gap, and a length of the upper base is less than the gap width. Accordingly, acoustic waves refracted at a side edge of the protrusion pass the gap without being so affected by the electrode at the end of the gap, and thus diffraction loss can be prevented more effectively. Accordingly, the resonance characteristics and the filter characteristics can be improved mode effectively.

In the present invention, the shape of the first and second protrusions is not particularly limited. However, in a specific aspect according to a preferred embodiment of the present invention, the first and second protrusions have an equiangular trapezoid shape in plan view, for example.

Alternatively, the first and second protrusions may have a plurality of corner portions, and the corner portions may be rounded. In this case, too, reflection and scattering of acoustic waves can be prevented.

In another specific aspect according to a preferred embodiment of the acoustic wave element according to the present invention, the second protrusion is preferably provided also in the other of the first and second electrode fingers.

In the acoustic wave element according to a preferred embodiment of the present invention, crossing width weighting may be applied to the at least one IDT electrode. When crossing width weighting is applied, a transverse-mode spurious can be suppressed, but a gap occurs in an acoustic wave propagation region of the IDT. This gap may cause degradation in resonance characteristics and filter characteristics. When a preferred embodiment of the present invention is used, reflection and scattering of acoustic waves can be suppressed even when crossing width weighting is applied, so that the resonance characteristics and the filter characteristics can be further improved or adjusted.

In a preferred embodiment of the present invention, the acoustic waves are not particularly limited, and surface acoustic waves or boundary acoustic waves can be used.

Preferably, the acoustic wave element according to a preferred embodiment of the present invention further includes a medium layer arranged to cover the at least one IDT electrode provided on the piezoelectric substance. A density of the at least one IDT electrode is equal to or higher than a density of the piezoelectric substance and a density of the medium layer, and a ratio between the density of the at least one IDT electrode and the density of the medium layer preferably is higher than about 1.22, for example.

In another specific aspect according to a preferred embodiment of the acoustic wave element according to the present invention, a medium layer is laminated to cover the at least one IDT electrode provided on the piezoelectric substance. A density of the at least one IDT electrode is equal to or higher than a density of the piezoelectric substance and a density of the medium layer, and a ratio between the density of the at least one IDT electrode and a higher one of the density of the piezoelectric substance and the density of the medium layer preferably is higher than about 1.22, for example.

In the acoustic wave element according to a preferred embodiment of the present invention, an IDT electrode includes a plurality of electrode fingers including first and second electrode fingers connected to different potentials. A gap is provided on an outer side in an electrode finger length direction of the first electrode finger. In an area near the gap, a first protrusion protrudes in an acoustic wave propagation direction from at least one of side edges of the first electrode finger. By providing the first protrusion, undesired reflection and scattering of acoustic waves in a region provided with the gap and a region near the gap are prevented, whereby resonance characteristics and filter characteristics can be effectively improved.

In the electrode finger provided with the first protrusion, change in characteristic due to change in shape of the end of the electrode finger is small, and thus change in characteristic due to manufacturing variations in shape of the electrode finger rarely occur. In addition, the resonance characteristics and the filter characteristics can be improved even when the gap at the end of the electrode finger is large. Thus, the area of the gap can be increased, which enables prevention of short-circuit failure between electrode fingers connected to different potentials.

According to a preferred embodiment of the present invention, the filter characteristics and the resonance characteristics can be effectively improved by only devising the shape of the IDT electrode, particularly by providing the first protrusion at a side edge of the first electrode finger. In this case where the characteristics are improved by forming the first protrusion, the first protrusion need not be so large as is clear from the description of the following preferred embodiments, and thus undesired short circuit and degradation in insulation resistance rarely occur.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 21 illustrates the relationship between the absolute value of reflection |Γ| and the spacing between a resonance frequency and a frequency at the upper end of the stopband in the first preferred embodiment, the first conventional example, and the first comparative example.

DETAILED DESCRIPTION OF THE PREFERRED EMBODIMENTS

Hereinafter, the present invention is disclosed by describing specific preferred embodiments of the present invention with reference to the drawings.

Structure of First Preferred Embodiment

Figure 1A:
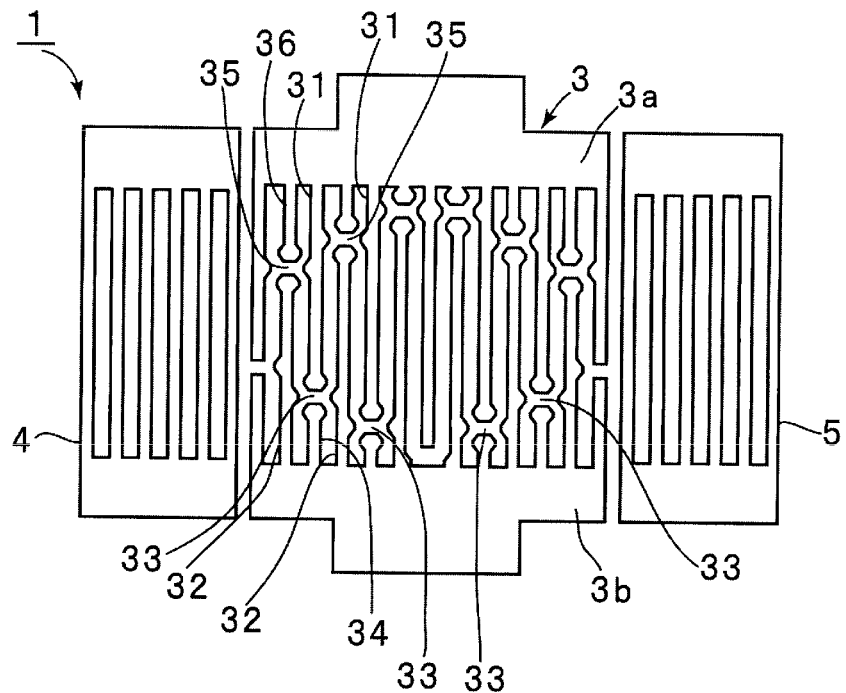
FIG. 1A is a schematic plan view illustrating an electrode structure of a SAW element according to a first preferred embodiment of the present invention.
Figure 1B:
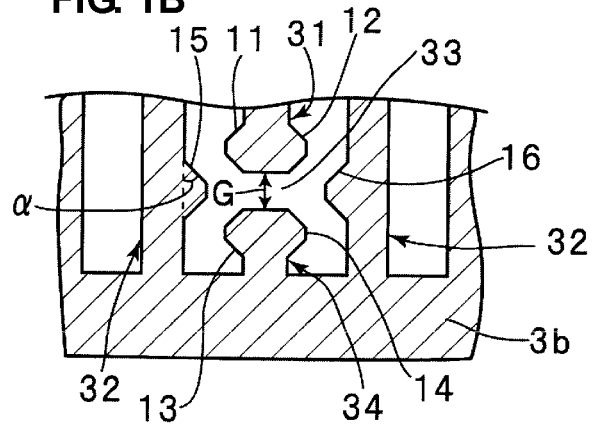
FIG. 1B is an enlarged partial plan view illustrating a main portion thereof.
Figure 2:
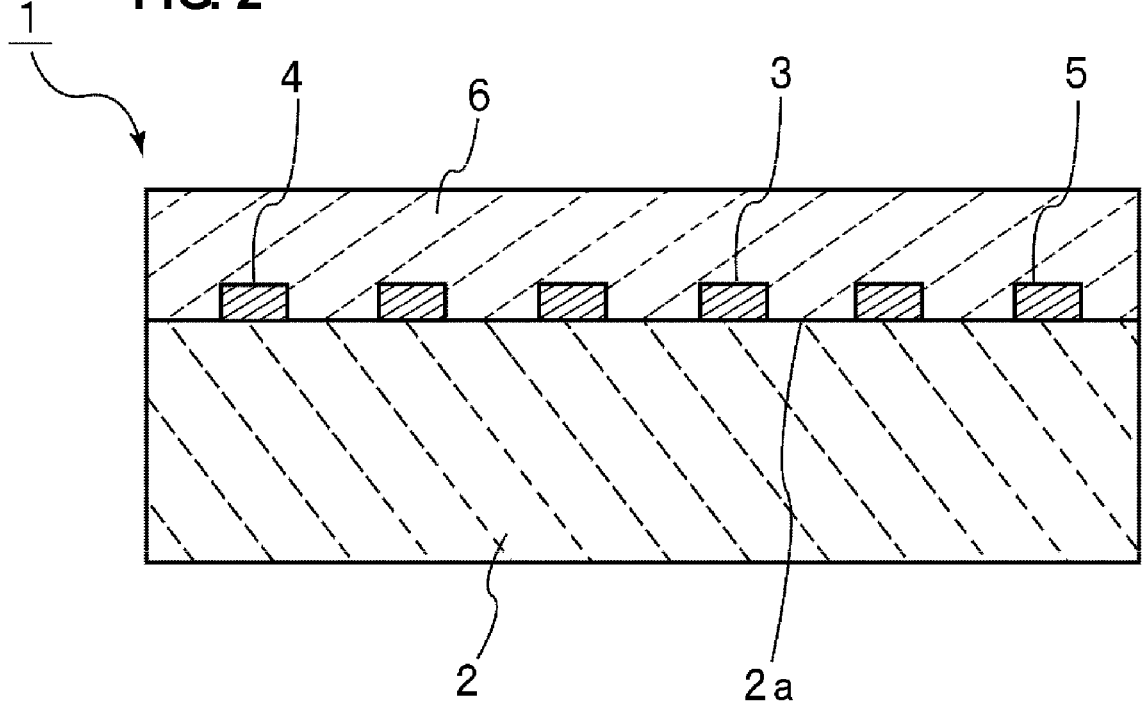
FIG. 2 is a front cross-sectional view of the SAW element according to the first preferred embodiment of the present invention.

FIG. 2 is a front cross-sectional view of an acoustic wave element according to a first preferred embodiment of the present invention, FIG. 1A is a schematic plan view illustrating an electrode structure of the acoustic wave element, and FIG. 1B is a schematic enlarged plan view of a main portion thereof.

As illustrated in FIG. 2, the acoustic wave element 1 includes a piezoelectric substrate 2, an IDT electrode 3 disposed on a top surface 2a of the piezoelectric substrate 2, reflectors 4 and 5, and a medium layer 6 that covers the IDT electrode 3 and the reflectors 4 and 5.

That is, the IDT electrode 3 is disposed on an interface between the piezoelectric substrate 2 and the medium layer 6.

In this preferred embodiment, the piezoelectric substrate 2 preferably is a 0° rotated Y-cut X-propagating $LiNbO_3$ substrate, for example. The piezoelectric substrate 2 may be composed of a $LiNbO_3$ substrate of another crystal orientation or may be composed of another piezoelectric single crystal, such as $LiTaO_3$ or quartz, for example, or other suitable material. Alternatively, the piezoelectric substrate 2 may be composed of a piezoelectric ceramic. The density of the piezoelectric substrate 2 composed of the $LiNbO_3$ substrate preferably is about 4.64 $g/cm^3$, for example.

On the other hand, the medium layer 6 preferably is composed of $SiO_2$ in this preferred embodiment, and the density thereof is about 2.2 $g/cm^3$. The material of the medium layer 6 is not limited to $SiO_2$, and the medium layer 6 may be composed of another insulating material, such as SiN.

In this preferred embodiment, a surface acoustic wave (SAW) device is excited.

The IDT electrode 3 and the reflectors 4 and 5 can be composed of an appropriate metal, such as Cu or Ag, for example. In this preferred embodiment, the IDT electrode 3 and the reflectors 4 and 5 preferably are composed of an electrode material primarily containing Cu. More specifically, the IDT electrode 3 and the reflectors 4 and 5 preferably are composed of a laminated metal film including a Ti film, a Cu film, and an AlCu film laminated in this order from the $LiNbO_3$ side. When the wavelength of propagated surface acoustic waves is defined as $\lambda$, normalized film thicknesses $h/\lambda$ normalized with $\lambda$ of the Ti film, Cu film, and AlCu film preferably are about 1.0%, about 5.0%, and about 0.5%, respectively, for example. Accordingly, this laminated metal film preferably is composed of an electrode material primarily containing Cu.

During manufacturing of the SAW element 1, a $SiO_2$ film having a normalized film thickness $h/\lambda$ of about 6.5% is formed on the above-described $LiNbO_3$ substrate. Then, a photoresist pattern is formed by photolithography on a region except the region where the IDT electrode 3 and the reflectors 4 and 5 are to be formed. Then, the $SiO_2$ film in the region not covered by the photoresist pattern is removed by reactive ion etching, for example. Then, the IDT electrode 3 and the reflectors 4 and 5 are preferably formed by using the above-described electrode material primarily containing Cu, and a residual photoresist pattern is removed. After that, a $SiO_2$ film having a normalized film thickness $h/\lambda$ of about 27% is formed on the entire surface. In this way, the SAW element 1 is obtained. Incidentally, the duty in the IDT electrode 3 is about 0.50, for example.

As illustrated in FIG. 1A, the IDT electrode 3 includes a pair of bus bars 3a and 3b extending in a SAW propagation direction. A plurality of first electrode fingers 31 and a plurality of second electrode fingers 32 are alternately arranged in the SAW propagation direction. The direction in which the first and second electrode fingers 31 and 32 extend is a direction that is perpendicular or substantially perpendicular to the SAW propagation direction. First ends of the plurality of first electrode fingers 31 connect to the first bus bar 3a whereas second ends thereof extend toward the second bus bar 3b. Gaps 33 are placed on outer sides in an electrode finger length direction of the ends of the plurality of first electrode fingers 31. Also, first dummy electrode fingers 34 are provided on extended lines in the length direction of the first electrode fingers 31 so as to face the first electrode fingers 31 via the gaps 33. The first dummy electrode fingers 34 connect to the bus bar 3b.

On the other hand, first ends of the plurality of second electrode fingers 32 connect to the bus bar 3b whereas second ends thereof extend toward the first bus bar 3a. Gaps 35 are placed on outer sides in the electrode finger length direction of the ends of the second electrode fingers 32. Second dummy electrode fingers 36 are arranged to face the second electrode fingers 32 via the gaps 35. The dummy electrode fingers 36 connect to the bus bar 3a.

In this preferred embodiment, the IDT electrode 3 is constituted by a first comb-shaped electrode including the plurality of first electrode fingers 31 and the bus bar 3a; and a second comb-shaped electrode including the plurality of second electrode fingers 32 and the bus bar 3b. In the IDT electrode 3, the plurality of first electrode fingers 31 and the plurality of second electrode fingers 32 are mutually interposed.

As shown in FIG. 1A, in the IDT electrode 3, the positions of the gaps 33 and 35 vary along the SAW propagation direction. In other words, crossing width weighting is applied so that a crossing width, which is a dimension of a crossing region where the adjoining first and second electrode fingers 31 and 32 overlap each other in the SAW propagation direction, varies in the SAW propagation direction.

Each of the reflectors 4 and 5 preferably is a grating reflector including a plurality of electrode fingers of which both ends are short circuited. The reflectors 4 and 5 are arranged on both sides in the SAW propagation direction of the IDT electrode 3. Alternatively, an open reflector of which both ends are not short circuited may be used as the reflectors.

A feature of the SAW element 1 of this preferred embodiment is that, as illustrated in the enlarged view in FIG. 1B, first protrusions 11, 12, 13, and 14 are provided in the first electrode finger 31 and the first dummy electrode finger 34 at the vicinity of the gap 33, the first protrusions protruding from at least one side edge in the SAW propagation direction. Specifically, in the first electrode finger 31, the first protrusions 11 and 12 are provided on both side edges of the first electrode finger 31 at the vicinity of the gap 33, the first protrusions protruding in the SAW propagation direction. Likewise, in the first dummy electrode finger 34, the first protrusions 13 and 14 protrude from the both side edges in the SAW propagation direction.

In the first electrode finger 31, only one of the first protrusions 11 and 12 may be provided. Likewise, in the first dummy electrode finger 34, only one of the first and second protrusions 13 and 14 provided on the both side edges may be provided.

Furthermore, at the vicinity of the gap 33, the first protrusions may be provided only in the first electrode finger 31. Alternatively, the first protrusions may be provided only in the first dummy electrode finger 34.

In FIG. 1B, the first protrusions 11, 12, 13, and 14 are provided in the first electrode finger 31 and the first dummy electrode finger 34 at the vicinity of the gap 33 provided at the end of the first electrode finger 31. Likewise, at the vicinity of the gap provided at the end of the second electrode finger 32, first protrusions are provided at the end of the second electrode finger 32 and/or the end of the second dummy electrode finger 36.

Another unique feature of the SAW element 1 of this preferred embodiment is that, as illustrated in FIG. 1B, second protrusions 15 and 16 are provided at portions facing the gap 33 of the second electrode fingers 32. The second protrusion 15 protrudes from the side edge facing the gap 33 of the second electrode finger 32 toward the gap 33. Likewise, the second protrusion 16 protrudes from the side edge facing the gap 33 toward the gap 33.

Also, as illustrated in FIG. 1A, second protrusions are provided at portions facing the gaps of the first electrode fingers 31 and 31 on both sides, in the gaps provided at the ends of the second electrode fingers 32.

Referring to FIG. 1B, the shapes of the first protrusions 11, 12, 13, and 14 and the second protrusions 15 and 16 are described more specifically.

In this preferred embodiment, the positions along the electrode finger length direction of the second protrusions 15 and 16 are substantially equal to the position along the electrode finger length direction of the gap 33.

As for the relationship between the positions of the protrusions 15 and 16 and the position of the gap 33, it is most preferable that their positions are equal to each other along the length direction of the electrode fingers 31 and 32. However, their positions need not always be equal to each other as long as the effects of the second protrusions 15 and 16 are not lost.

In this preferred embodiment, the first protrusions 11 and 12 preferably have an equiangular trapezoid shape in plan view. That is, the first protrusions 11 and 12 preferably have an equiangular trapezoid shape in plan view, a portion coinciding with a side edge of the first electrode finger 31 being a lower base. The top portion of each of the first protrusions 11 and 12 is an upper base. The lower base and the upper base are connected by a pair of side edges. Also, the first protrusions 13 and 14 have the same shape as that of the first protrusions 11 and 12. Alternatively, the first protrusions 11 to 14 may have a shape other than the equiangular trapezoid shape in plan view. Additionally, the first protrusions 11 and 12 and the first protrusions 13 and 14 provided in the dummy electrode finger 34 need not always be the same, but desirably should be the same. Accordingly, SAW propagation statuses on both sides of the gap 33 in the electrode finger length direction can be equivalent to each other, so that more favorable resonance characteristics and filter characteristics can be obtained.

The second protrusions 15 and 16 have an equiangular trapezoid shape in plan view. The portion coinciding with a side edge of the electrode finger corresponds to the lower base of the equiangular trapezoid, whereas the top side of each of the second protrusions 15 and 16 is an upper base. The upper base and the lower base are connected by a pair of inclining side edges so that an inner angle α is formed with respect to the lower base. The second protrusions 15 and 16 preferably are the same as protrusions described in WO2006/109591.

The centers in the electrode finger length direction of the lower bases of the equiangular trapezoids coincide with the center in the electrode finger length direction of the gap 33. In other words, the position to divide the gap 33 into two portions in the electrode finger length direction and the midpoint along the electrode finger direction of the lower base coincide with each other in the electrode finger length direction. Since the trapezoid preferably is an equiangular trapezoid, the inner angle α is less than 90°.

In the description given below, the dimension along the electrode finger length direction of the gap 33 is defined as gap width G; the maximum dimension along the electrode finger length direction of the second protrusion 15, i.e., the dimension in the electrode finger length direction of the lower base of the protrusion 15, is defined as W; and the height of the second protrusion 15, i.e., the dimension in the SAW propagation direction of the protrusion protruded from the side edge of the electrode finger 32 toward the gap, is defined as protrusion height H.

Figure 3A:
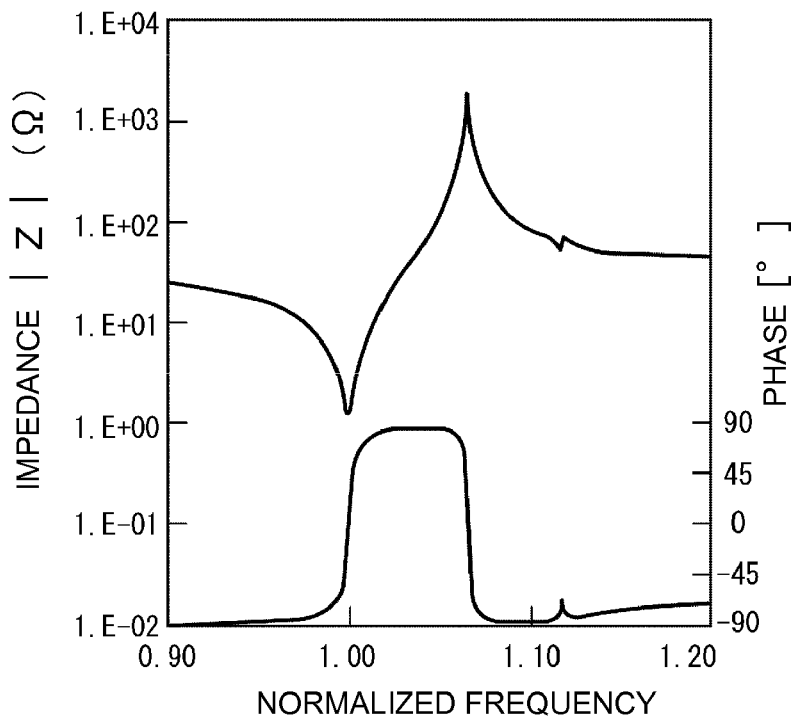
FIG. 3A illustrates an impedance characteristic and a phase characteristic of the SAW element of the first preferred embodiment of the present invention.
Figure 3B:
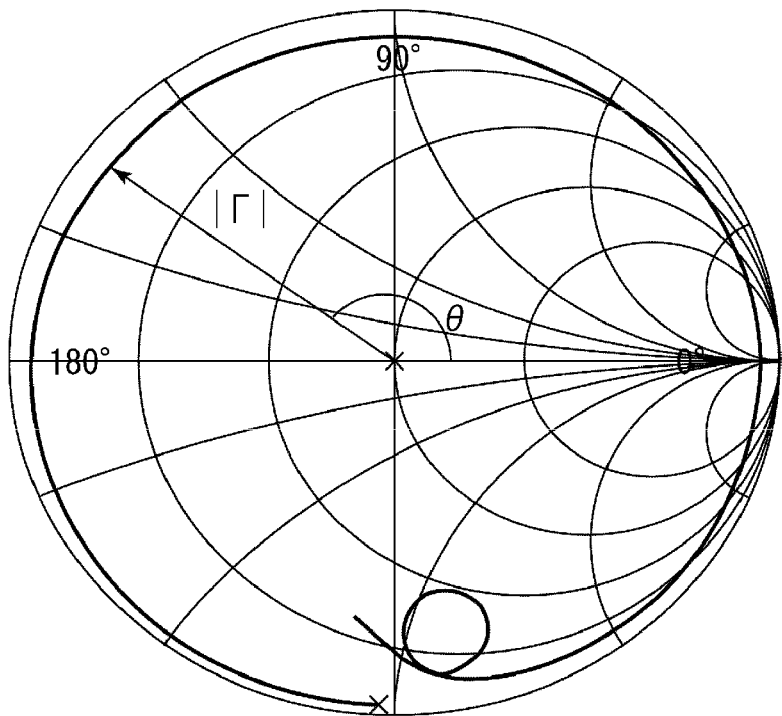
FIG. 3B is an impedance Smith chart illustrating impedance.

FIGS. 3A and 3B illustrate a phase characteristic and an impedance characteristic of the SAW element 1 of this preferred embodiment provided with the first protrusions 11, 12, 13, and 14 and the second protrusions 15 and 16. $|\Gamma|$ and $\theta$ in FIG. 3B are expressed by $|\Gamma|e^{j\theta}=(Z-Z_0)/(Z+Z_0)$, in which Z represents an input impedance of the one-port SAW resonator 1 and $Z_0$ represents a characteristic impedance in a measurement system. $\Gamma$ represents an absolute value of reflection $|\Gamma|$ whereas $\theta$ represents a phase of reflection $\theta$. As the absolute value of reflection $|\Gamma|$ is larger, the characteristic as resonator is better, which is desirable. The point where the phase of reflection $\theta$ is 180° indicates the characteristic at a resonance point whereas the point where the phase of reflection $\theta$ is 0° indicates the characteristic at an antiresonance point.

Figure 5:
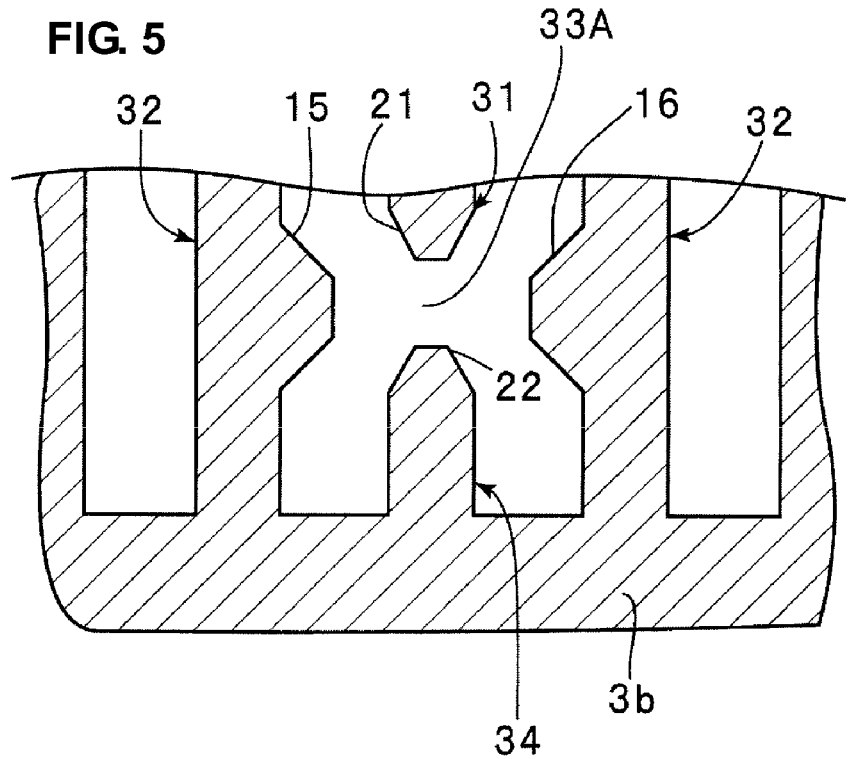
FIG. 5 is a partial plan view illustrating a main portion of an electrode structure of a SAW element of a first comparative example prepared for comparison.
Figure 6:
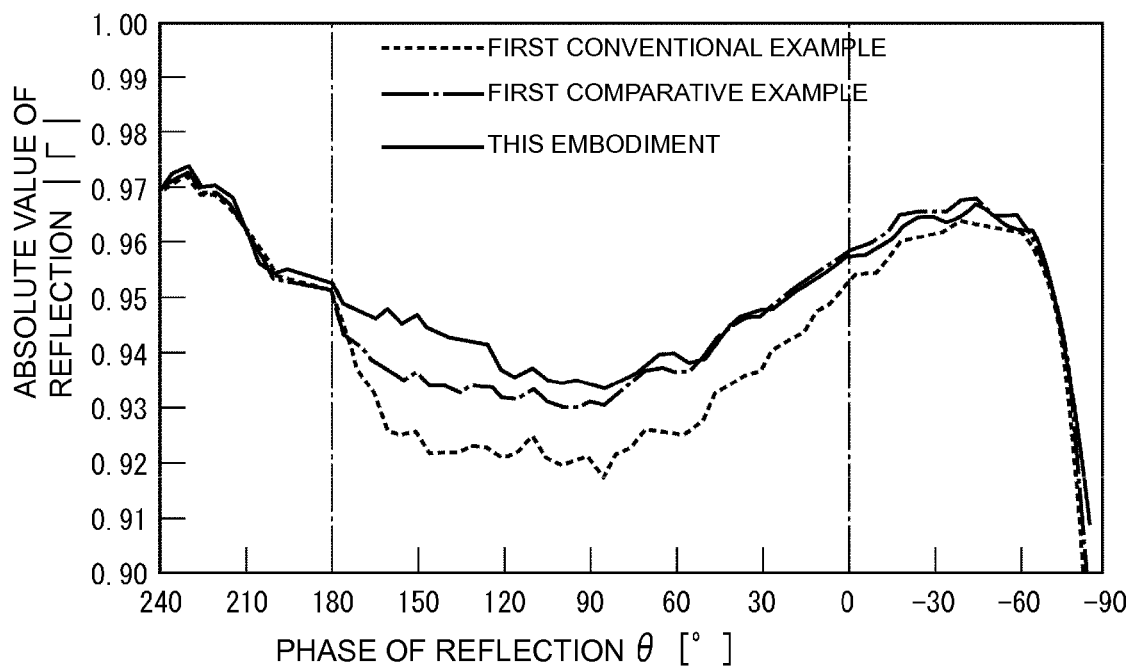
FIG. 6 illustrates the relationship between a phase of reflection θ and an absolute value of reflection |Γ| of the SAW elements of the first preferred embodiment, the first conventional example, and the first comparative example.

The relationship between the phase of reflection $\theta$ and the absolute value of reflection $|\Gamma|$ in FIG. 3B is shown as a solid line in FIG. 6. For comparison, the relationships between the phase of reflection $\theta$ and the absolute value of reflection $|\Gamma|$ in the cases where IDT electrodes having the shapes illustrated in FIGS. 4 and 5 are used are shown as a broken line and a chain line in FIG. 6, respectively.

Figure 4:
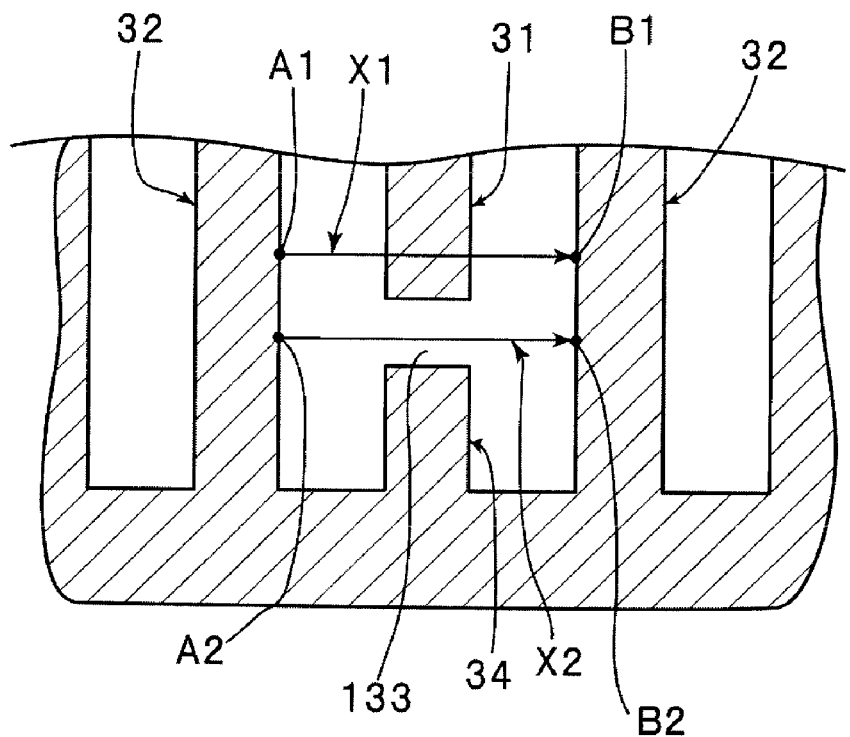
FIG. 4 is a partial plan view illustrating a main portion of an electrode structure of a SAW element of a first conventional example prepared for comparison.

FIGS. 4 and 5 are partial plan views illustrating main portions of IDT electrodes of SAW resonators of a first conventional example and a first comparative example prepared for comparison, and illustrate the portions corresponding to the portion illustrated in FIG. 1B of the above-described preferred embodiment.

In the first preferred embodiment, the first protrusions 11 to 14 and the second protrusions 15 and 16 are provided. However, the first and second protrusions are not provided in the conventional example illustrated in FIG. 4. Other than that, the first conventional example is the same as the first preferred embodiment of the present invention.

On the other hand, in the first comparative example illustrated in FIG. 5, tapered portions 21 and 22 that taper down toward the end are provided at the end of the first electrode finger 31 and the end of the first dummy electrode finger 34 at the vicinity of a gap 33A. Also, the second protrusions 15 and 16 are provided in the second electrode fingers 32 and 32, as in the first preferred embodiment of the present invention.

That is, the first comparative example preferably has the same structure as that of the above-described preferred embodiment except that the first protrusions 11 to 14 are not provided and that the tapered portions 21 and 22 are provided.

As shown in FIG. 6, according to the above-described preferred embodiment, the absolute value of reflection $|\Gamma|$ from the resonance point where $\theta=180°$ to the antiresonance point where $\theta=0°$ is larger compared to the first conventional example. Therefore, it is apparent that the characteristic of resonator is significantly improved.

In the first comparative example, as in the above-described preferred embodiment, the absolute value of reflection |Γ| from θ=180° to θ=0° is larger compared to the first conventional example, and the resonance characteristics is improved compared to the first conventional example. However, according to the above-described preferred embodiment, the absolute value of reflection |Γ| near the resonance point, i.e., near θ=180° to 90°, is significantly larger compared to the first comparative example, and thus the resonance characteristics can be further improved.

As described above, it is apparent from the comparison with the first conventional example and the first comparative example that the structure of the above-described preferred embodiment including the first protrusions 11 to 14 and the second protrusions 15 and 16 enables a significant improvement in resonance characteristic. The reason for this is as follows.

In the first comparative example illustrated in FIG. 5, the second protrusions 15 and 16 are provided as in the first preferred embodiment. The structure including the second protrusions 15 and 16 is described in WO2006/109591 and has the following effects. That is, providing the second protrusions 15 and 16 causes an effective propagation distance of surface acoustic waves in the gap 33 or 33A to be substantially equivalent with an effective propagation distance of surface acoustic waves in a portion where the gap 33 or 33A is not provided, e.g., a portion where the electrode finger 31 exists. Accordingly, a phase shift of surface acoustic waves between the portion provided with the gap 33 or 33A and the other portion becomes small, which improves the characteristic.

More specifically, in the first conventional example not including the second protrusions 15 and 16 as illustrated in FIG. 4, surface acoustic waves propagate in the manner indicated by arrow X1 in the portion where the first electrode finger exists, whereas surface acoustic waves propagate in the manner indicated by arrow X2 in the region where a gap 133 is provided. In this case, surface acoustic waves propagate from point A1 toward point B1 in the propagation path indicated by arrow X1. On the other hand, surface acoustic waves propagate from point A2 toward point B2 in the portion where the gap 133 is provided. Therefore, although the distance between point A1 and point B1 is equal to the distance between point A2 and point B2, no electrode exists in the propagation path indicated by arrow X2 whereas the first electrode finger exists in the propagation path indicated by arrow X1. Accordingly, a phase shift occurs between the surface acoustic waves propagating in the manner indicated by arrow X1 and the surface acoustic waves propagating in the manner indicated by arrow X2.

On the other hand, in the first comparative example and the above-described preferred embodiment, the phase of the surface acoustic waves propagating in the portion provided with the gap 33 or 33A is approximately equal to or preferably the same as the phase of the surface acoustic waves propagating in the region other than the gap in accordance with the second protrusions 15 and 16, whereby the resonance characteristics are improved.

The reason for the further improvement of characteristic in the above-described preferred embodiment compared to the first comparative example is as follows.

A mismatch of acoustic impedance near the gap at the end of the electrode finger is prevented by the existence of the first protrusions 11 to 14, which suppresses and minimizes undesired reflection and scattering of surface acoustic waves.

Figure 1C:
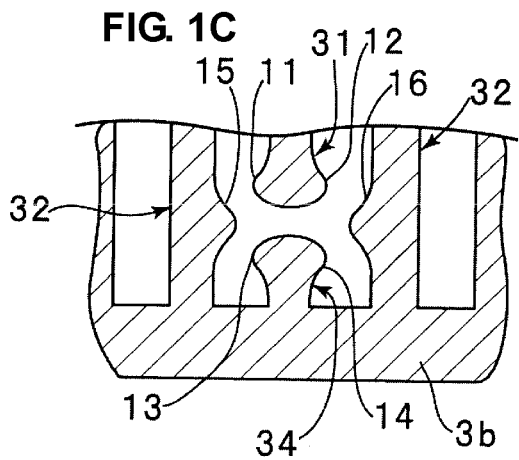
FIG. 1C is a schematic plan view illustrating a modified structure of the first preferred embodiment in which outer edges of first and second protrusions are rounded.

Each of the first protrusions 11 to 14 and the second protrusions 15 and 16 has an equiangular trapezoid shape and is a region surrounded by a plurality of straight lines. However, when the IDT electrode is formed by a photolithography method, each of the first protrusions 11 to 14 and the second protrusions 15 and 16 may have a round shape as illustrated in FIG. 1C. That is, an outer shape of the first and second protrusions 11 to 16 need not always be a polygonal shape surrounded by a plurality of straight lines and may have a curved line. When the protrusions have such a curved outer edge, changes in characteristics due to variations of the shape in forming the electrode fingers can be prevented. This is because, even if the protrusion is slightly displaced in the electrode finger length direction or in the SAW propagation direction, displacement at the electrode finger continuously changes in a curved line, so that variations of the shape rarely occur. Thus, the first and second protrusions preferably have a curved outer edge.

Figure 7:
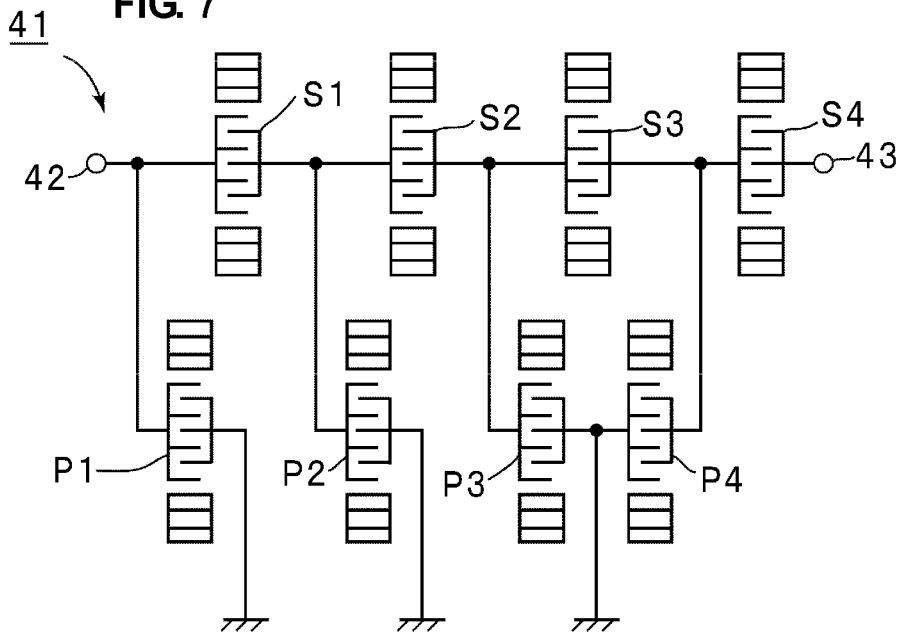
FIG. 7 is a schematic plan view illustrating an electrode structure of a transmission filter device including the SAW element of the first preferred embodiment of the present invention.

The above-described SAW element 1 can be used in various oscillators and filter devices. As an example, a circuit structure of a transmission filter used in a duplexer DPX of a mobile phone is schematically illustrated in FIG. 7. The transmission filter 41 is a transmission filter used in the duplexer DPX of a mobile phone in a WCDMA method. The transmission filter 41 includes an input terminal 42 and an output terminal 43. A plurality of series arm resonators S1 to S4 connect to a series arm that connects the input terminal 42 and the output terminal 43 to each other. Also, parallel arm resonators P1, P2, P3, and P4 connect between the series arm and an earth potential. The SAW resonator of the above-described preferred embodiment is used as each of the series arm resonators S1 to S4. Also, the SAW resonator of the first conventional example is used as each of the parallel arm resonators P1 to P4.

Figure 8:
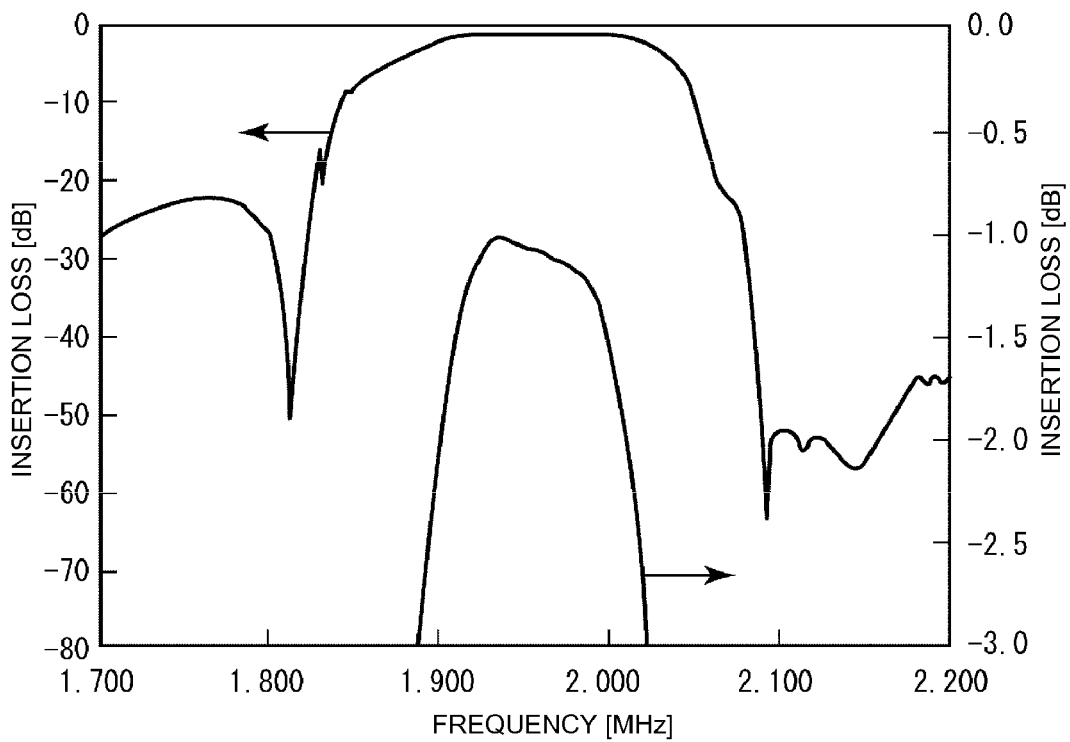
FIG. 8 illustrates an attenuation/frequency characteristic of the transmission filter illustrated in FIG. 7.

FIG. 8 illustrates an attenuation/frequency characteristic of the transmission filter having the above-described structure.

Figure 9:
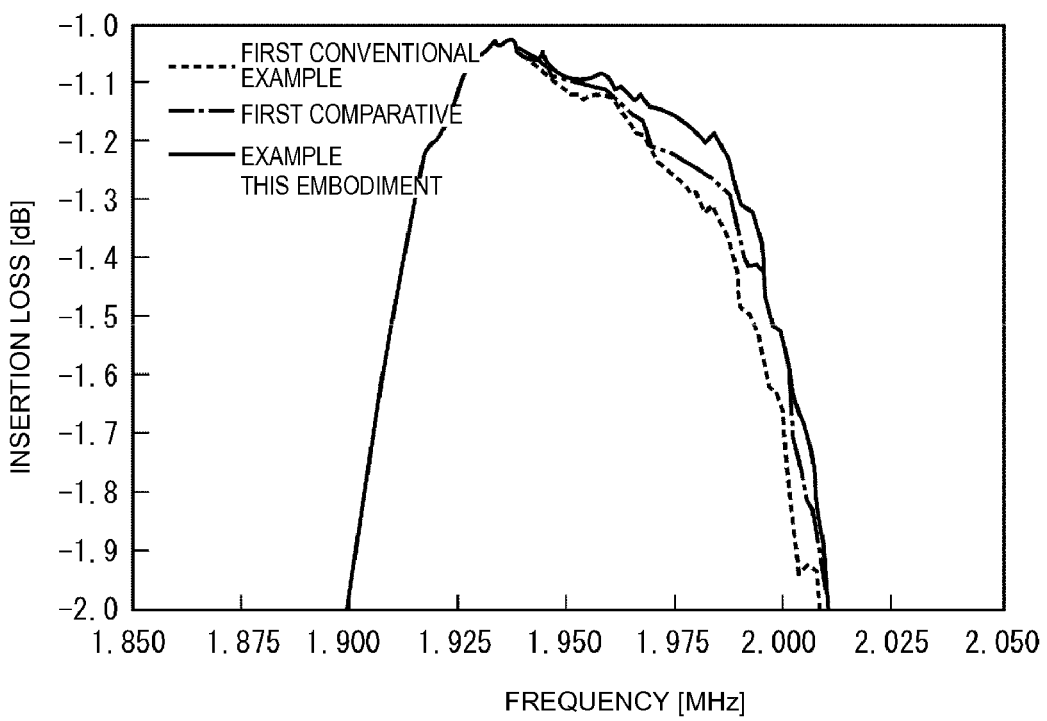
FIG. 9 illustrates attenuation/frequency characteristics of the transmission filter illustrated in FIG. 7 and respective transmission filters including the SAW element of the first conventional example and the SAW element of the first comparative example prepared for comparison.

FIG. 9 is an enlarged view illustrating a main portion of the attenuation/frequency characteristic illustrated in FIG. 8. For comparison, a broken line in FIG. 9 indicates an attenuation/frequency characteristic of a transmission filter having the same structure as that of the transmission filter 41 except that the SAW resonator of the first conventional example is used as each of the series arm resonators. Also, a chain line in FIG. 9 indicates an attenuation/frequency characteristic of a transmission filter having the same structure except that the SAW resonator of the first comparative example is used as each of the series arm resonators.

As shown in FIG. 9, it is apparent that, in the transmission filter 41, the insertion loss in a frequency region on the high-frequency side of a passband can be reduced by about 0.05 dB to about 0.1 dB compared to the insertion loss of the corresponding transmission filters using the SAW resonators of the first conventional example and the first comparative example. This is because the absolute value of reflection |Γ| at the vicinity of the resonance point of the SAW resonator is large in the SAW resonator of the above-described preferred embodiment of the present invention.

Figure 10:
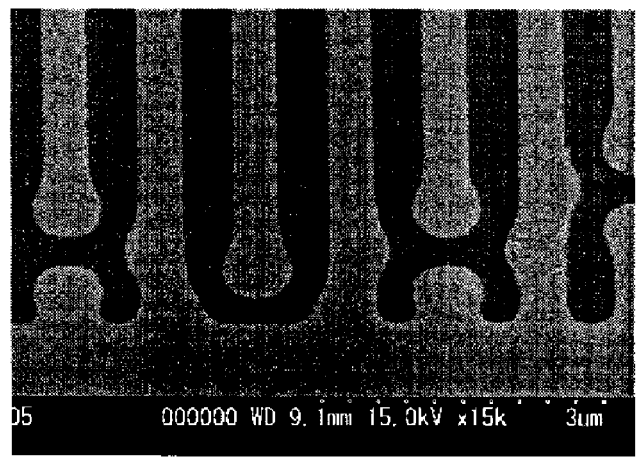
FIG. 10 is a scanning electron micrograph showing actual shapes of end portions of the electrode structure of the SAW element of the first preferred embodiment of the present invention.

FIG. 10 illustrates a scanning electron micrograph of an end portion of the IDT electrode in the SAW element 1 of the above-described preferred embodiment. In the scanning electron micrograph illustrated in FIG. 10, it can be seen that the first and second protrusions have a round shape.

Also, resistance to pressure against electrostatic breakdown of each of the transmission filter 41 of the above-described preferred embodiment, the transmission filter including the SAW resonator of the first conventional example, and the transmission filter including the SAW resonator of the first comparative example was measured.

As a result, the voltage for a breakdown probability of about 5% was about 180 V in the transmission filter including the SAW resonator of the first conventional example and was about 175 V in the transmission filter including the SAW resonator of the first comparative example. On the other hand, the voltage was about 175 V in the transmission filter of the above-described preferred embodiment. Therefore, it is apparent that, in the SAW resonator provided with the first and second protrusions, a surge withstand voltage is equivalent to that in the case of using the SAW resonator of the first conventional example or the first comparative example.

Influence of Gap Width G

Then, in the SAW resonator of the first preferred embodiment, whether the resonance characteristics changes depending on the gap width G of the gap 33 was determined.

Figure 11:
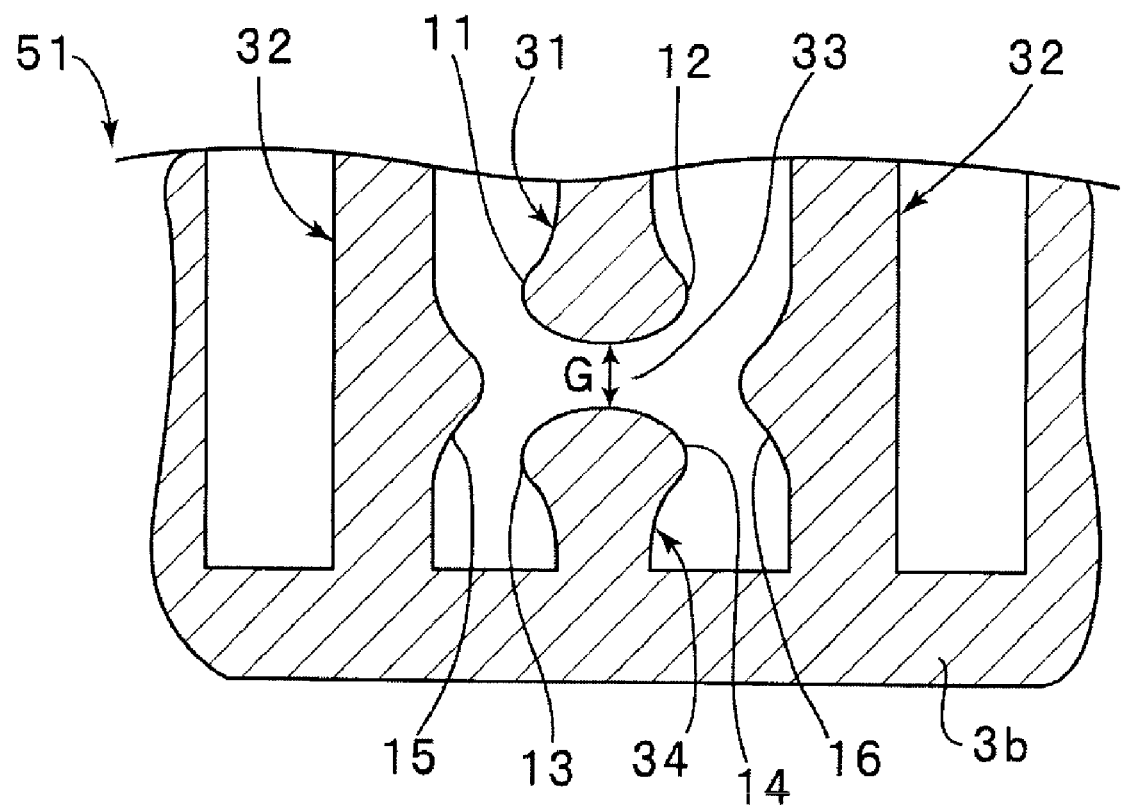
FIG. 11 is a schematic plan cross-sectional view illustrating a state around the gap at an end of a first electrode finger in the electrode structure of the first preferred embodiment of the present invention.
Figure 12A:
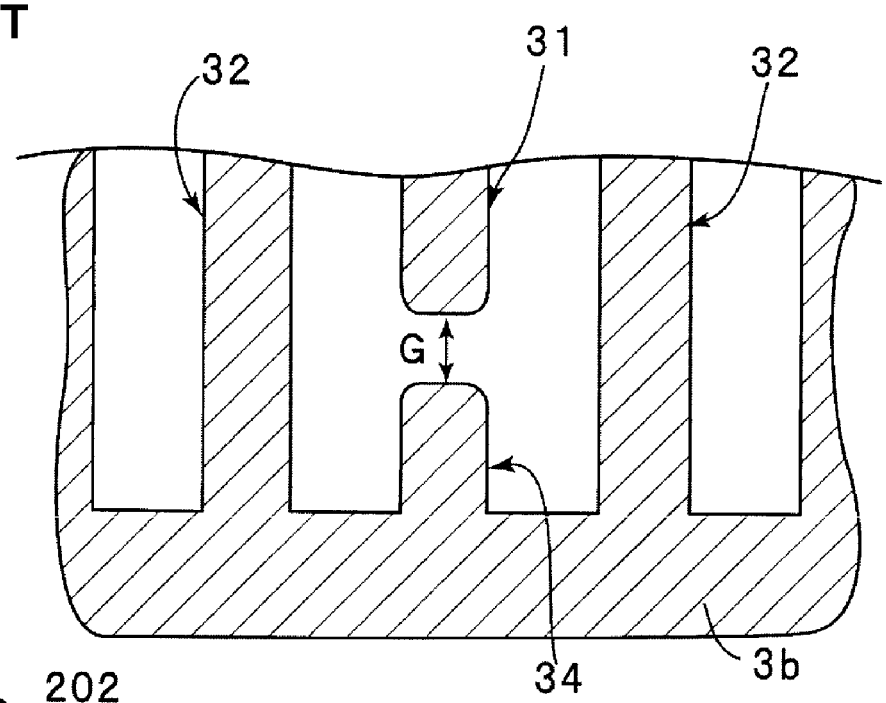
FIG. 12A is a partial plan view illustrating the electrode structure around the gap of the SAW element of the first conventional example prepared for comparison.
Figure 12B:
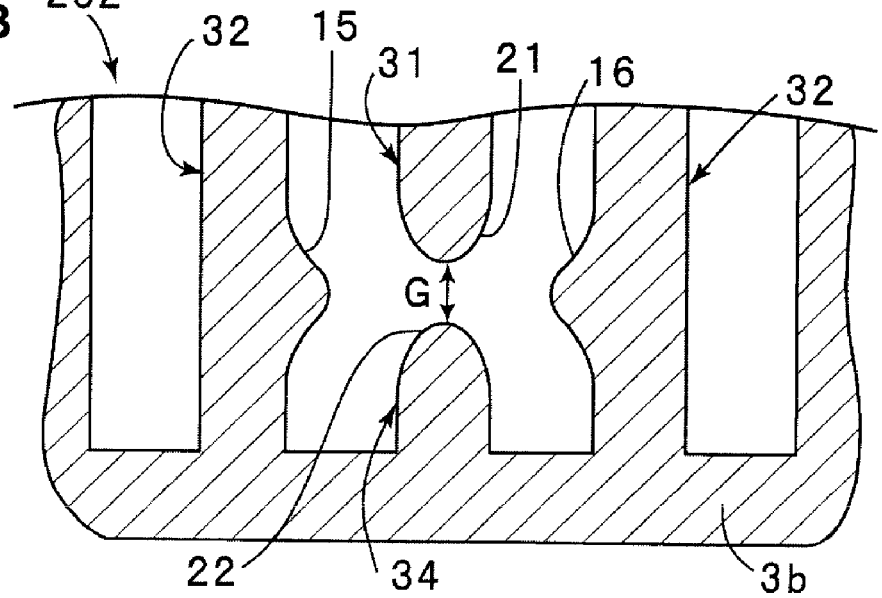
FIG. 12B is a partial plan view schematically illustrating the electrode structure around the gap of the SAW element of the first comparative example.

As a modification of the first preferred embodiment, a SAW element having the electrode structure illustrated in FIG. 11 was fabricated. The SAW element 51 illustrated in FIG. 11 has the same structure as that in the first preferred embodiment except that the first and second protrusions have a curved outer edge, i.e., is a SAW resonator same as that illustrated in FIG. 1C. For comparison, a SAW resonator having the electrode structure of the first conventional example illustrated in FIG. 12A and a SAW resonator having the electrode structure of the first comparative example illustrated in FIG. 12B were also formed. In the respective SAW resonators 201 and 202 illustrated in FIGS. 12A and 12B, the shape of the electrode fingers of the first conventional example and the first comparative example described above prepared for comparison with the first preferred embodiment was slightly changed so that the outer edge of the electrode fingers has a round shape.

In each of the SAW resonators 51, 201, and 202, the absolute value of reflection |Γ| at the vicinity of the resonance point was measured by changing the gap width G. The measurement result is shown in FIG. 13.

The respective gap widths G were obtained by observing the IDT electrodes of the fabricated SAW resonators by using a scanning electron microscope.

Figure 13:
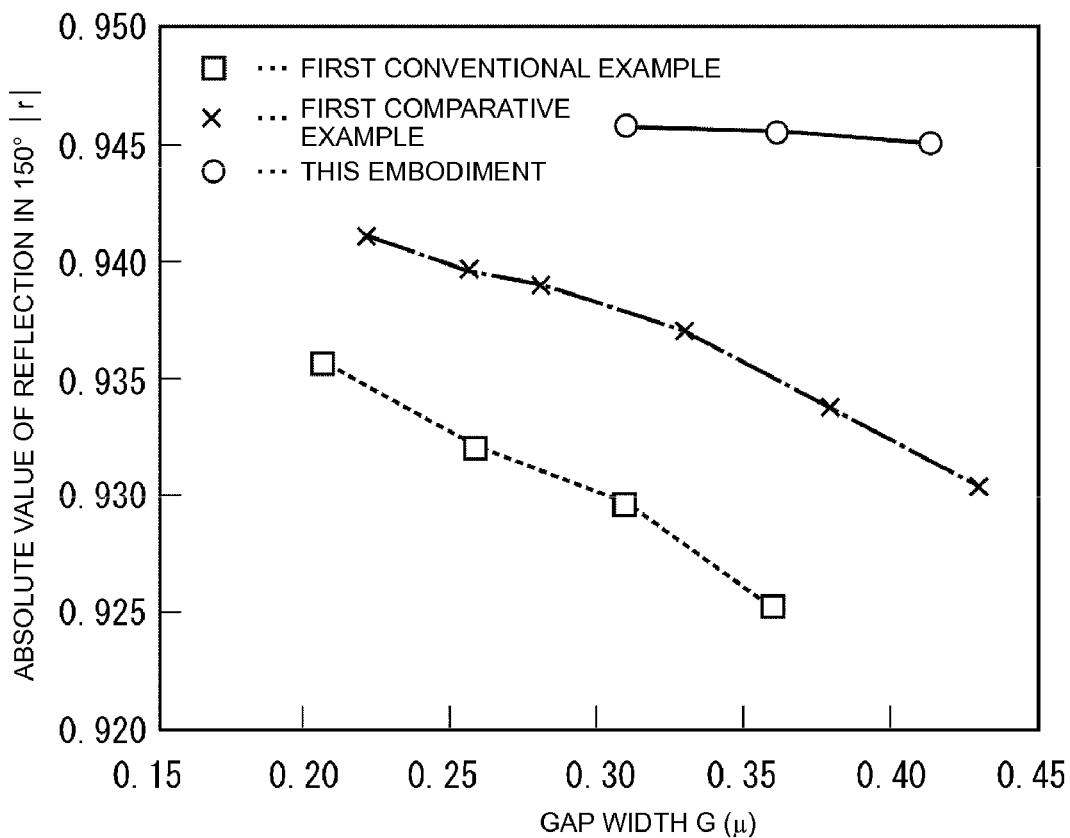
FIG. 13 illustrates the relationship between a gap width G and an absolute value of reflection |Γ| in the respective SAW element of the first preferred embodiment, the first conventional example, and the second comparative example.

As shown in FIG. 13, it is apparent that, in the first conventional example and the first comparative example, the absolute value of reflection |Γ| does not increase and the characteristic is not improved unless the gap width G is decreased. However, a decrease in gap width G can cause a short-circuit failure due to variations in manufacturing.

On the other hand, in this preferred embodiment, the absolute value of reflection |Γ| does not significantly change even if the gap width G is changed. Thus, the gap width G can be relatively large, so that a short-circuit failure can be prevented without causing degradation of the characteristic.

Influence of Second Protrusions

Then, an influence of the size and existence of the second protrusions 15 and 16 in the above-described preferred embodiment was evaluated.

Figure 14:
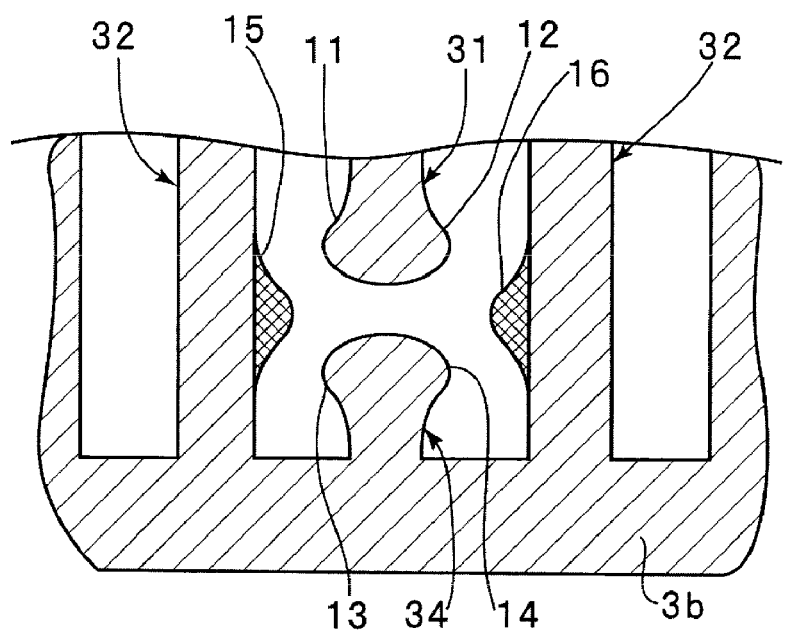
FIG. 14 is a schematic partial plan view illustrating a structure in which the area of the second protrusions in the SAW element of the first preferred embodiment is changed.

As illustrated in FIG. 14, the area of the first protrusions 15 and 16 in the SAW resonator of the above-described preferred embodiment was variously changed. In FIG. 14, the first protrusions 15 and 16 are shown with cross hatching. A plurality of types of SAW resonators 1 of the first preferred embodiment was fabricated by variously changing the area of the first and second protrusions 15 and 16 while fixing the shape of the first protrusions 11 to 14.

Figure 15:
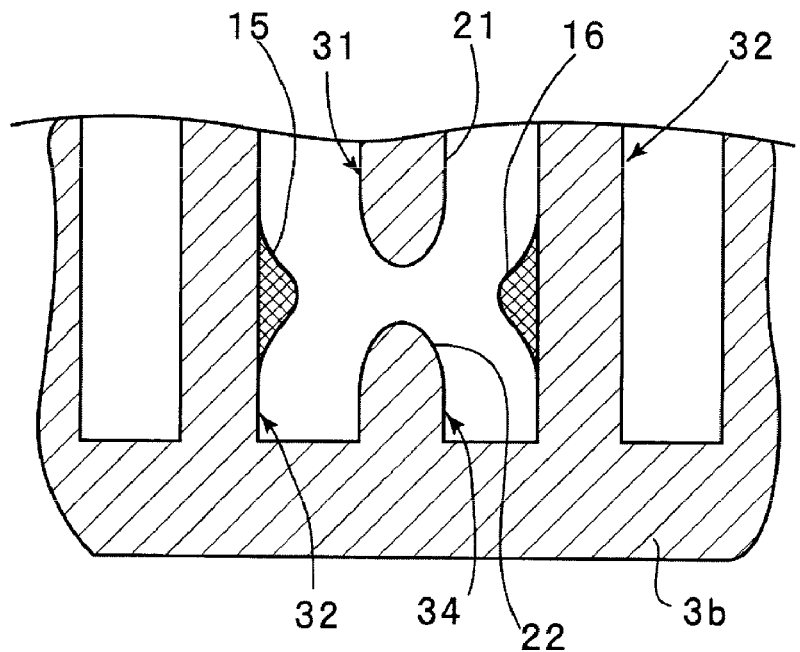
FIG. 15 is a schematic partial plan view illustrating a structure in which the area of the second protrusions in the SAW element of the first comparative example is changed.

For comparison, a SAW element 203 of the first comparative example illustrated in FIG. 15 was fabricated. In the SAW resonator 203, the first protrusions are not provided, and the ends of the first electrode finger and the first dummy electrode finger have a round shape. On the other hand, the second protrusions 15 and 16 are shown with cross hatching. A plurality of types of SAW elements 203 were fabricated by variously changing the area of the second protrusions 15 and 16.

Figure 16:
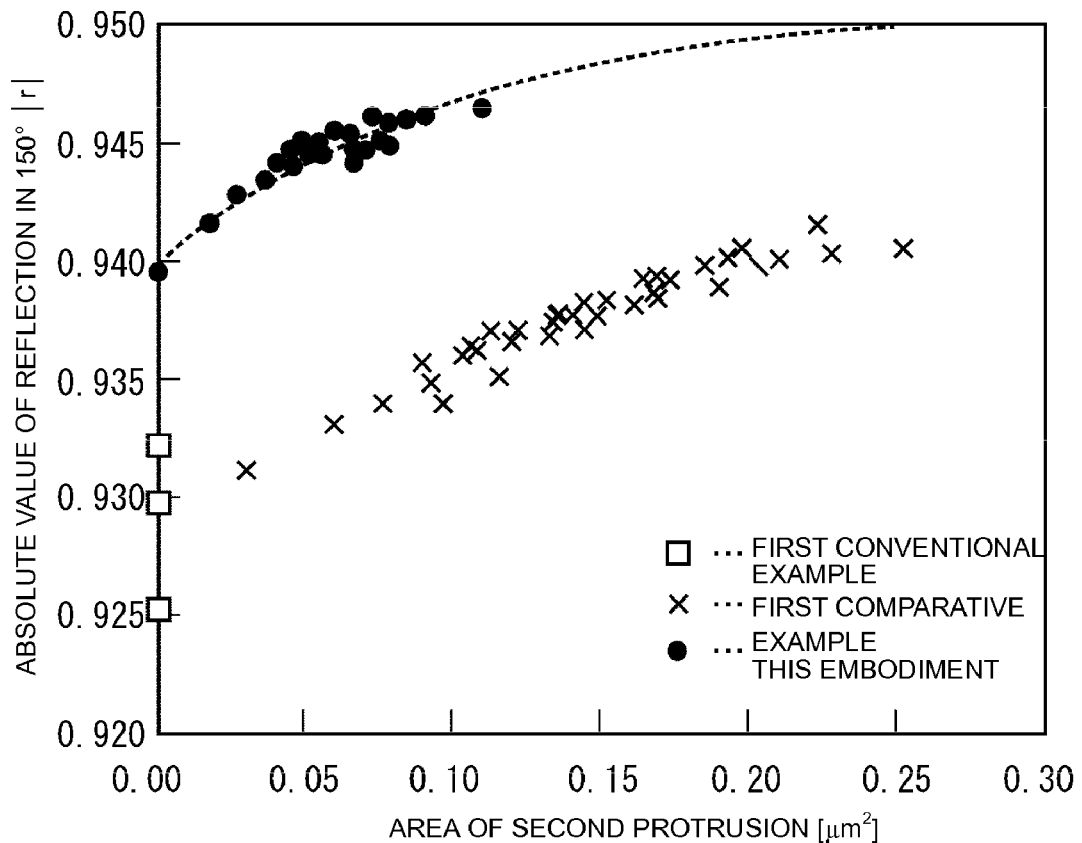
FIG. 16 illustrates the relationship between the area of the second protrusion and the absolute value of reflection |Γ| in the SAW elements of the first preferred embodiment, the first conventional example, and the first comparative example.

FIG. 16 illustrates the relationship between the area of the second protrusion and the absolute value of reflection |Γ| at the vicinity of the resonance point in the SAW resonators of the embodiment and the SAW resonators 203 of the first comparative example fabricated in the above-described manner.

The area of the second protrusion was obtained by observing it in a scanning electron micrograph. The horizontal axis of FIG. 16 indicates the area of a single protrusion.

As shown in FIG. 16, it is apparent that the absolute value of reflection |Γ| becomes larger and the characteristic becomes more favorable as the area of the first protrusion becomes larger both in the present preferred embodiment and the first comparative example. Thus, it is apparent that the area of the second protrusions 15 and 16 should desirably be a certain area or larger.

Also, it is apparent that the absolute value of reflection |Γ| is not great as long as the area of the first protrusion is not great in the first comparative example.

Also, it is apparent that the absolute value of reflection |Γ| is 0.932 or less in the SAW device corresponding to the above-described first conventional example not provided with the second protrusions, i.e., the protrusions shown with cross hatching in FIG. 15.

On the other hand, it is apparent that, in the above-described preferred embodiment, the absolute value of reflection |Γ| is sufficiently large regardless of the size of the second protrusions and the absolute value of reflection |Γ| is very large (for example, about 0.939) even when the second protrusions are not provided, i.e., even when the area of the second protrusions is 0, compared to the first comparative example.

Therefore, it is apparent from FIG. 6 that, according to a preferred embodiment of the present invention, the absolute value of reflection |Γ| can be sufficiently large and a favorable resonance characteristic can be obtained by providing the first protrusions even if the second protrusions are not provided.

More preferably, it is apparent that the resonance characteristics can be further enhanced by providing the second protrusions 15 and 16 and by increasing the area of the second protrusions 15 and 16.

Change in Characteristic Due to Change in Shape of First Protrusions

Figure 17:
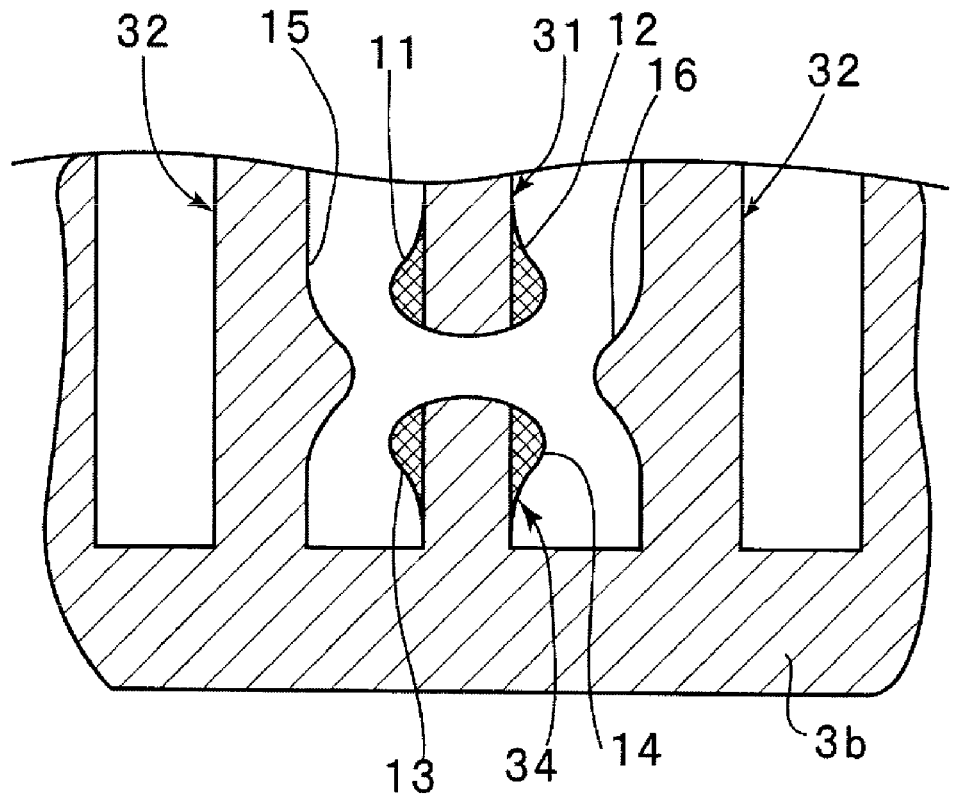
FIG. 17 is a schematic partial plan view illustrating a structure in which the area of the first protrusions in the SAW element of the first preferred embodiment is changed.

Then, changes in characteristic were evaluated by fixing the shape of the second protrusions 15 and 16 and by variously changing the first protrusions 11 to 14 shown with cross hatching as schematically illustrated in FIG. 17 in the above-described preferred embodiment.

Figure 18:
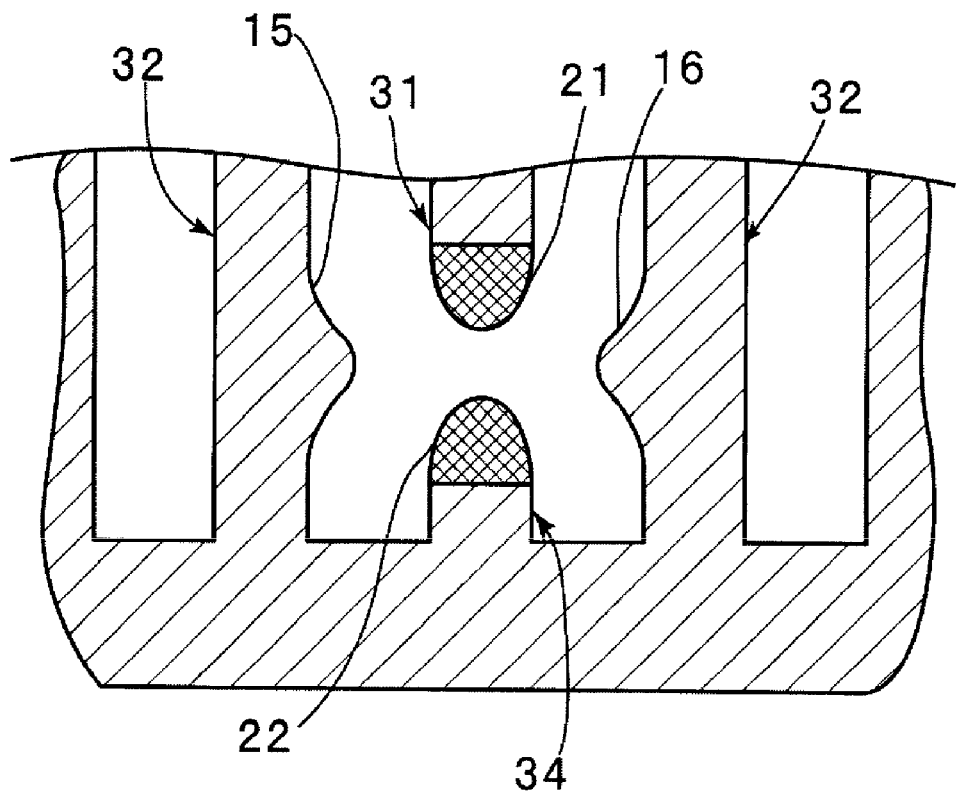
FIG. 18 is a schematic partial plan view illustrating a structure in which the electrode shape of the ends of the electrode finger and the dummy electrode finger in the SAW element of the first comparative example is changed.

For comparison, changes in characteristic were evaluated by fixing the area of the second protrusions as in the above-described preferred embodiment and by variously changing the area of tapered portions 21 and 22 shown with cross hatching at the ends of the first electrode finger and the first dummy electrode finger in the electrode structure corresponding to the first comparative example illustrated in FIG. 18.

Figure 19:
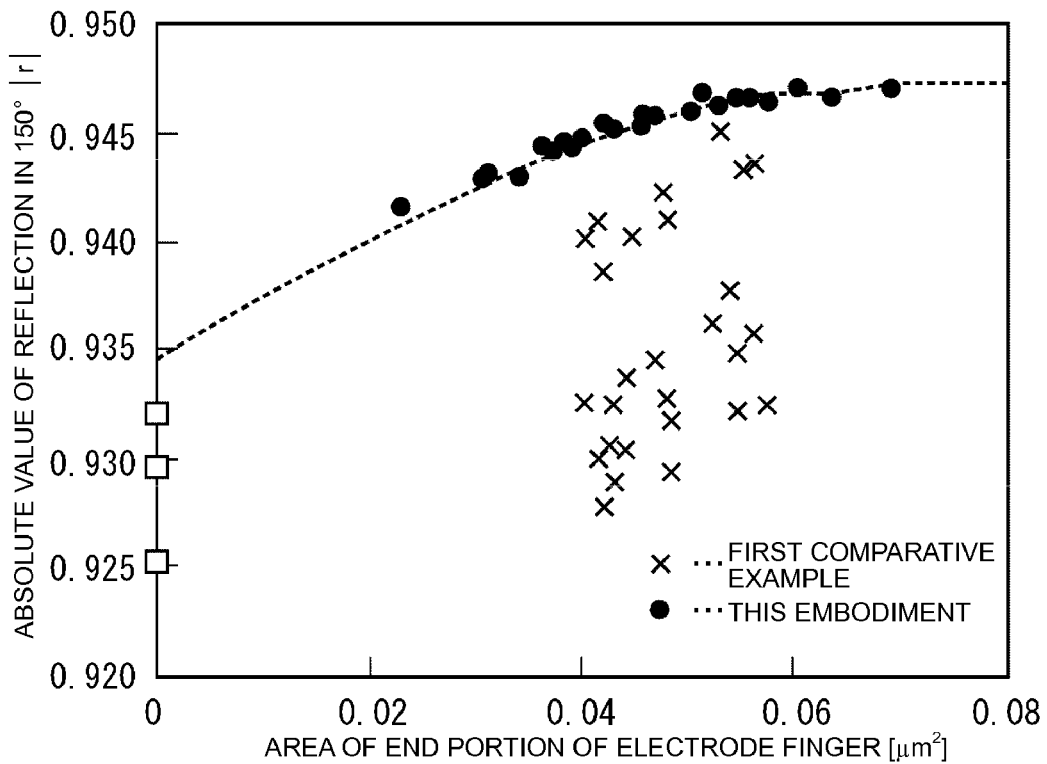
FIG. 19 illustrates the relationship between the area of an end portion of the electrode finger and the absolute value of reflection |Γ| in the SAW elements of the first preferred embodiment and the first comparative example.

FIG. 19 illustrates the result, which shows changes in absolute value of reflection |Γ| at the vicinity of the resonance point in the case where the area of the first protrusions 11 to 14 at the ends of the first electrode finger and the first dummy electrode finger or the area of the tapered portions 21 and 22 at the ends was changed.

As shown in FIG. 19, it is apparent that, in the first comparative example, the characteristic significantly varies when the area and shape of the tapered portions 21 and 22 at the ends of the electrode fingers are changed. That is, it is apparent that, in the first comparative example, the resonance characteristics heavily depend on the shape of the ends of the electrode fingers.

Also, it is apparent that, in the above-described preferred embodiment, the absolute value of reflection |Γ| becomes larger as the area of the first protrusions 11 to 14 are larger, whereby the characteristic becomes more favorable. Thus, it is apparent that the area of the first protrusions 11 to 14 should desirably be large such that degradation of insulation properties of the SAW resonator is prevented.

Also, it is apparent that variations in characteristic due to variations in electrode shape during manufacturing rarely occur in this preferred embodiment.

Since variations in characteristic due to variations in electrode shape during manufacturing rarely occur, a SAW resonator having a stable characteristic can be provided.

Relationship Between Stopband and Characteristic

Figure 20:
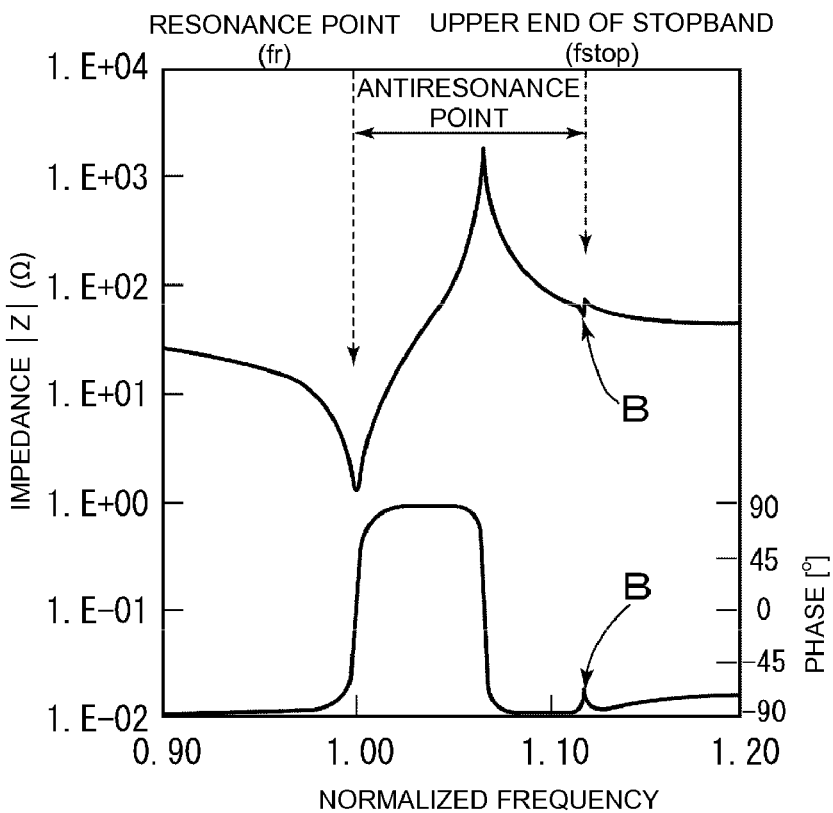
FIG. 20 illustrates an impedance characteristic and a phase characteristic to explain the relationship among a resonance point, an antiresonance point, and a stopband in the SAW element of the first preferred embodiment of the present invention.

In the SAW resonator of the above-described preferred embodiment, a reflection coefficient of surface acoustic waves by an IDT electrode should desirably be large, and a wider stopband can be obtained as the reflection coefficient is larger. When the reflection coefficient of surface acoustic waves by an IDT electrode is small and when the stopband is narrow, a ripple B positioned on the frequency at the upper end of the stopband indicated by arrow B may become approximate to a resonance frequency and an antiresonance frequency in the resonance characteristics illustrated in FIG. 20, for example.

FIG. 21 illustrates the relationship between spacing between the resonance frequency and the frequency at the upper end of the stopband of the IDT electrode and the absolute value of reflection |Γ| at the vicinity of the resonance point, i.e., θ=150° in the SAW resonator of the above-described preferred embodiment. The vertical axis in FIG. 21 indicates the values (%) indicating the spacing between the resonance frequency and the frequency at the upper end of the stopband of the IDT electrode as $(f_{stop}-fr)/fr$, in which fr represents the resonance frequency whereas $f_{stop}$ represents the frequency at the upper end of the stopband.

For comparison, the relationship between the absolute value of reflection |Γ| and the spacing between the resonance frequency and the frequency at the upper end of the stopband in each of the SAW resonators of the first conventional example and the first comparative example was obtained in the same manner. The results are illustrated in FIG. 21.

As shown in FIG. 21, it is apparent that, in the first comparative example, the spacing between the resonance frequency and the frequency at the upper end of the stopband is narrow when the absolute value of reflection |Γ| is large.

Also, as shown in FIG. 21, it is apparent that, in the first conventional example, the absolute value of reflection |Γ| is not so large although the spacing between the resonance frequency and the frequency at the upper end of the stopband is wide.

On the other hand, it is apparent that, in this preferred embodiment, the spacing between the resonance frequency and the frequency at the upper end of the stopband is not narrow even when the absolute value of reflection |Γ| is large. That is, the resonance characteristics can be improved without causing the stopband to be narrow.

Modifications

Figure 22A:
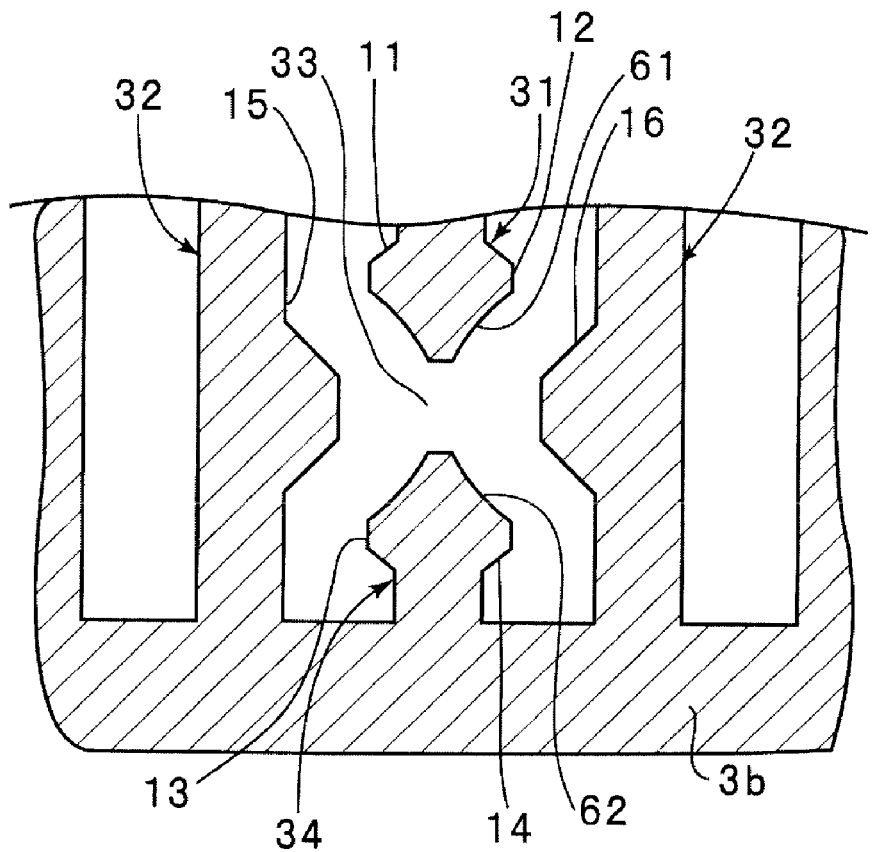
FIGS. 22A and 22B are partial plan views illustrating modifications of the SAW element provided with tapered portions at the ends of the electrode fingers in addition to the first and second protrusions.

FIG. 22A is a schematic partial plan view illustrating a modification of the SAW resonator of the above-described preferred embodiment.

In the SAW resonator of the above-described preferred embodiment, the above-described first and second protrusions 11 to 16 are provided. Alternatively, as in the modification illustrated in FIG. 22A, tapered portions 61 and 62 may be provided in addition to the first protrusions 11 to 14 and the second protrusions 15 and 16. The tapered portion 61 is a portion tapered down at the end of the first electrode finger 31. Likewise, the tapered portion 62 is a tapered portion in the first dummy electrode finger 34. The first protrusions 11 to 14 are provided at positions off the ends of the electrode finger 31 and the dummy electrode finger 34. The tapered portions 61 and 62 are provided separately from the first protrusions 11 and 12 or the first protrusions 13 and 14. Side edges of the electrode finger from the first protrusions 11 and 12 to the tapered portion 61 are curved in a concave shape. Likewise, side edges of the electrode finger from the first protrusions 13 and 14 to the tapered portion 62 are curved in a concave shape.

FIG. 22A illustrates the tapered portions 61 and 62 of the first electrode finger 31 and the dummy electrode finger 34. Also, the tapered portions may be provided at the ends of the second electrode finger and the second dummy electrode finger in the same manner.

In this modification, providing the tapered portions 61 and 62 enables a smaller phase difference in surface acoustic waves that propagate in the portion provided with the gap 33 and the region other than the gap 33. Accordingly, the resonance characteristics can be further improved.

That is, the first protrusions 11 to 14 are provided to reduce the difference between the SAW propagating paths indicated by arrows X1 and X2 in FIG. 4. This decreases the portion provided with the gap 33 and the phase shift of surface acoustic waves, so that the resonance characteristics are improved. In this modification where the tapered portions 61 and 62 are provided, fluctuations of propagation of surface acoustic waves from the portion provided with the gap 3 to the opposite side in the electrode finger length direction can be moderate, and also a difference in effective propagation distance of surface acoustic waves can be reduced.

Therefore, a phase shift can be compensated more effectively and the resonance characteristics can be further improved accordingly.

Figure 22B:
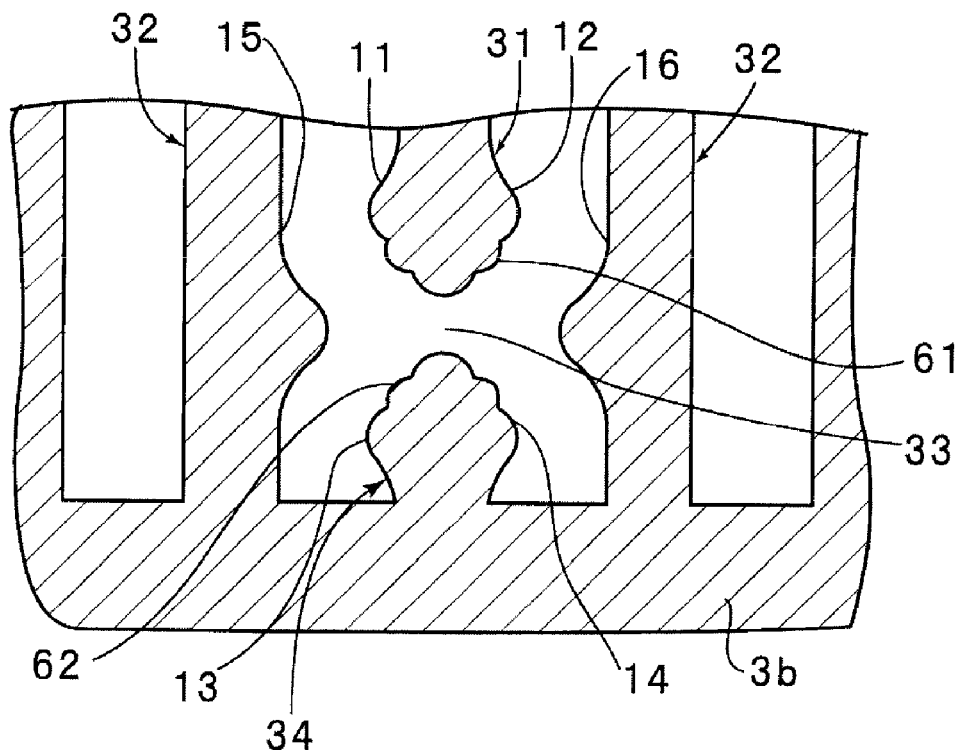

Alternatively, as in a modification illustrated in FIG. 22B, the first protrusions 11 and 12 may be rounded, and also the tapered portion 61 may be rounded. In this case, the first protrusions 13 and 14 and the tapered portion 62 are also rounded. In this way, the tapered portions 61 and 62 may have a round outer edge, as the first protrusions 11 to 14. Furthermore, in FIG. 22B, side edges of the electrode finger from the first protrusions 11 and 12 to the tapered portion 61 and side edges of the electrode finger from the first protrusions 13 and 14 to the tapered portion 62 are curved in a convex shape. In this way, the side edges of the electrode finger from the first protrusions to the tapered portion may be curved in a concave shape or in a convex shape. In any case where the side edges of the electrode finger are curved, variations in shape rarely occur during manufacturing of electrode fingers. That is, variations in characteristic due to variations in shape rarely occur. Accordingly, a SAW element having a stable characteristic can be provided.

Second Preferred Embodiment

As in the first preferred embodiment, a one-port boundary acoustic wave (BAW) resonator was fabricated. In this preferred embodiment, an IDT electrode 3 and reflectors 4 and 5 were formed on a piezoelectric substrate 2 composed of a 15° rotated Y-cut X-propagating $LiNbO_3$, and also a $SiO_2$ film was formed. The $LiNbO_3$ substrate has a thickness of 350 μm, whereas the medium layer composed of $SiO_2$ has a thickness of 6 μm. Since the $SiO_2$ film has a sufficient thickness unlike in the first preferred embodiment, boundary acoustic waves are excited in this preferred embodiment. Also, the IDT electrode and reflectors were formed of a laminated metal film including NiCr/Au/NiCr laminated in this order, having the following thicknesses: NiCr/Au/NiCr=10 nm/75 nm/10 nm.

The IDT electrode includes 60 pairs of electrode fingers, and the number of electrode fingers in each reflector is 51. In the IDT electrode 3, the crossing width is 30λ whereas the aperture width is 30.4λ. Also, in the IDT electrode, the crossing width is 30λ at the center and becomes smaller toward the both ends, i.e., the crossing width is 15λ at the both ends. In this way, crossing width weighting is applied.

The wavelength λ determined by the pitch of the electrode fingers in the IDT electrode is 1.6 μm, the width L of each electrode finger in the IDT electrode is 0.44 μm, and the space width S between adjoining electrode fingers is 0.36 μm. Also, the gap width G of the gap illustrated in an enlarged view of a main portion in FIG. 23 is 0.3 μm.

Figure 23:
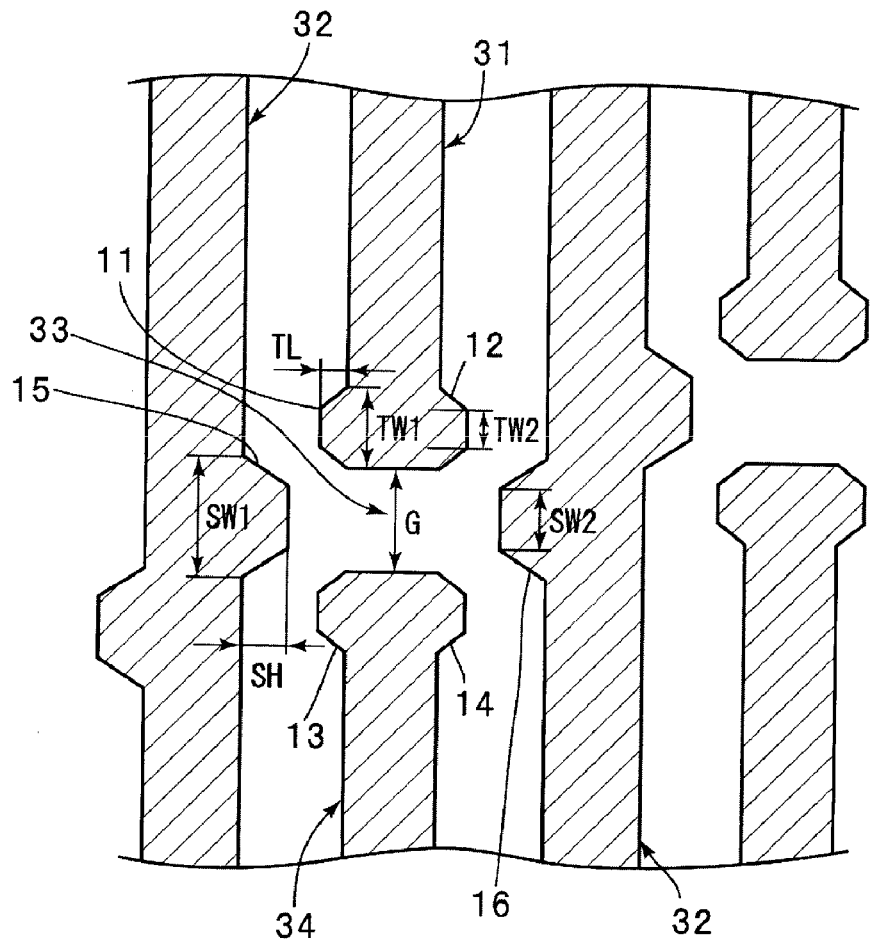
FIG. 23 is a schematic partial plan view illustrating a dimensional relationship in an electrode structure around a gap in a BAW element of a second preferred embodiment of the present invention.

Furthermore, as illustrated in FIG. 23, first protrusions 11 to 14 and second protrusions 15 and 16 were formed. The dimensions in FIG. 23 of the first protrusions 11 to 14 and the second protrusions 15 and 16 are as follows: TL=0.188 μm, TW1=0.329 μm, TW2=0.188 μm, SW1=0.47 μm, SH=0.166 μm, and SW2=0.094 μm.

For comparison, a BAW resonator of a second conventional example having the same structure as that in the second preferred embodiment except that the first and second protrusions are not provided was fabricated.

Figure 24:
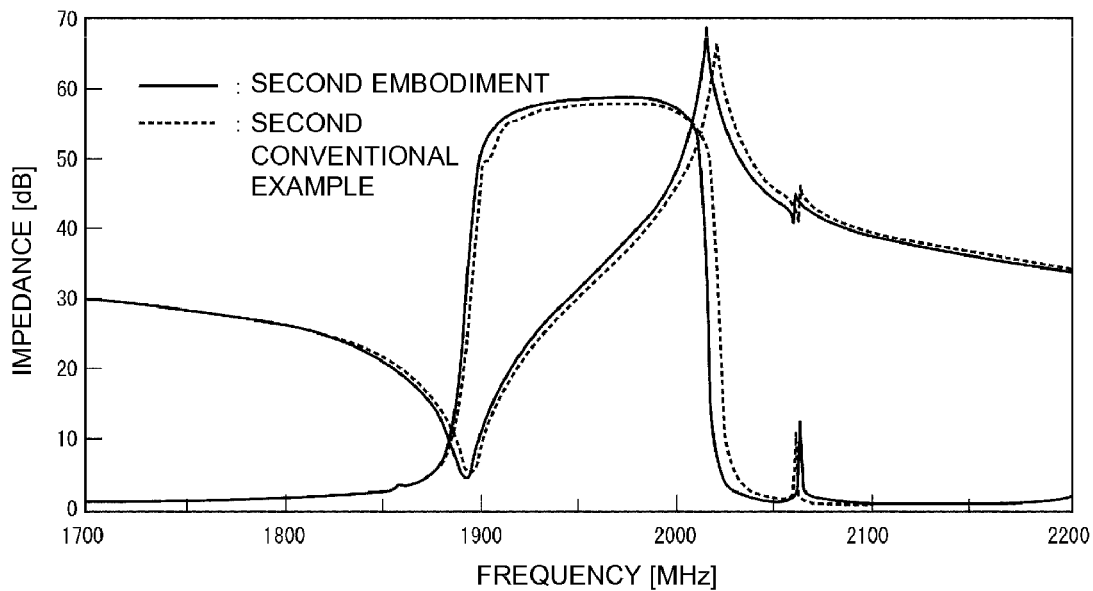
FIG. 24 illustrates an impedance characteristic and a phase characteristic of the BAW element of the second preferred embodiment and a BAW element of a first conventional example prepared for comparison.

The impedance-frequency characteristics and the phase characteristics of the BAW resonators of the second preferred embodiment and the second conventional example prepared in the above-described manner are shown in FIG. 24 with a solid line and a broken line, respectively.

As shown in FIG. 24, it is apparent that, according to the second preferred embodiment, a peak-to-valley ratio, i.e., the ratio of impedance at an antiresonance point to impedance at a resonance point, can be increased from an impedance ratio of 60 dB in the second conventional example to an impedance ratio of about 63 dB in the second preferred embodiment.

Third Preferred Embodiment

Figure 25:
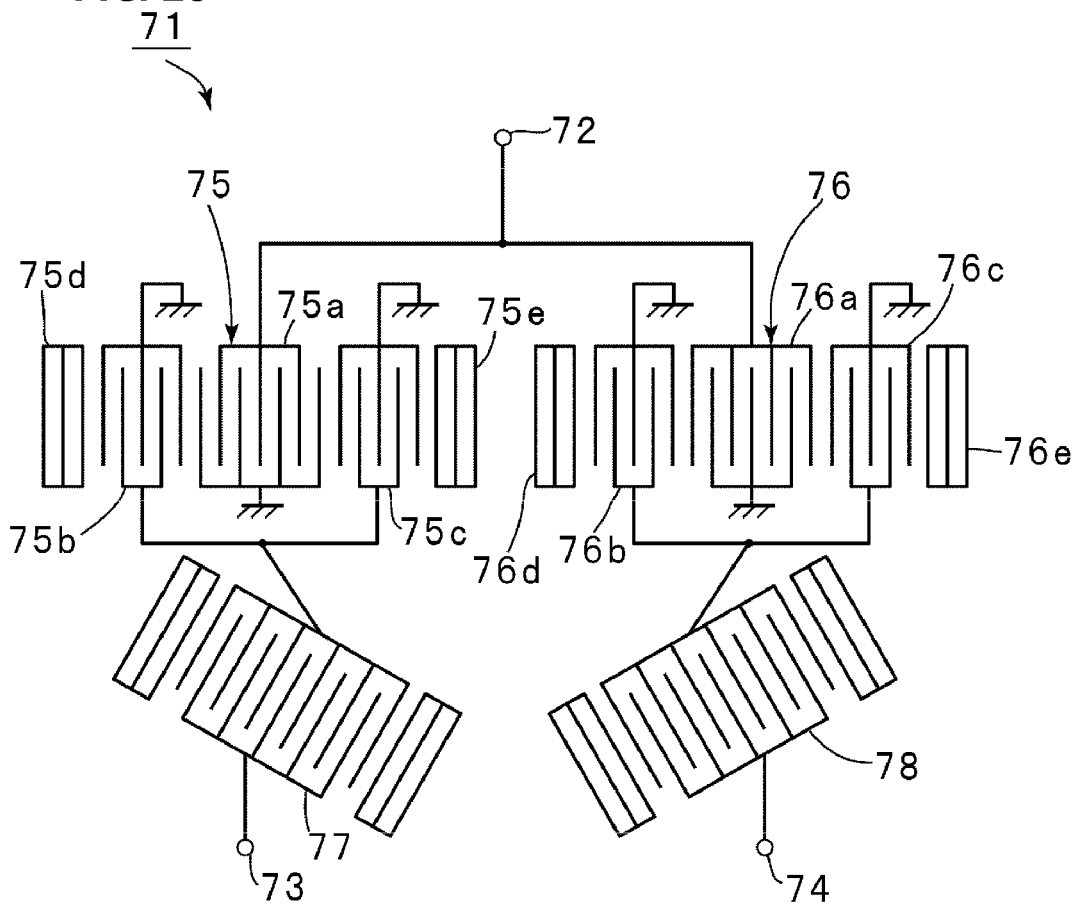
FIG. 25 is a schematic plan view illustrating an electrode structure of a BAW filter device of a third preferred embodiment of the present invention.

A BAW filter device 71 illustrated in FIG. 25 was fabricated. The BAW filter device 71 includes a bandpass filter having a balanced-to-unbalanced transforming function provided with an unbalanced terminal 72 and first and second balanced terminals 73 and 74. Here, the unbalanced terminal 72 connects to first and second longitudinally-coupled resonator BAW filters 75 and 76. Each of the longitudinally-coupled resonator BAW filters 75 and 76 preferably is a 3-IDT longitudinally-coupled resonator BAW filter device including a first IDT 75a or 76a and second and third IDTs 75b and 75c or 76b and 76c disposed on both sides in the BAW propagation direction of the first IDT. Reflectors 75d, 75e, 76d, and 76e are disposed on both sides in the BAW propagation direction of the regions provided with the IDTs 75a to 75c and 76a to 76c, respectively.

First ends of the first IDTs 75a and 76a connect in common to the unbalanced terminal 72, whereas second ends thereof connect to a ground potential.

First ends of the second and third IDTs 75b an 75c connect in common to the first balanced terminal 73 via a first one-port BAW resonator 77. Second ends of the IDTs 75b and 75c connect to a ground potential.

Likewise, first ends of the second and third IDTs 76b and 76c connect in common to the second balanced terminal 74 via a one-port BAW resonator 78. Second ends of the IDTs 76b and 76c connect to a ground potential.

Any of the BAW filter devices 75 and 76 and the BAW resonators 77 and 78 has a laminated structure of SiO/IDT electrode/15' rotated Y-cut X-propagation $LiNbO_3$. The $LiNbO_3$ substrate has a thickness of 350 μm, and the $SiO_2$ has a thickness of 6 μm.

The electrode has a structure including Al/Ti/Ni/Au/Ni laminated in this order from the top. The thicknesses thereof are as follows: Al/Ti/Ni/Au/Ni=100/10/10/55/10 nm.

In the BAW filter devices 75 and 76, the number of pairs of electrode fingers in each IDT is as follows. Each of the first IDTs 75a and 76a at the center has 10.5 pairs of electrode fingers, whereas each of the second and third IDTs 75b, 75c, 76b, and 76c has 6.5 pairs of electrode fingers. Each of the reflectors has 15 electrode fingers.

In each IDT electrode, the crossing width of electrode fingers is 25λ and the aperture width is 25.4λ. Crossing width weighting is applied to each IDT electrode so that the crossing width of electrode fingers at the center of the IDT electrode is 25λ and that the crossing width becomes smaller from the center toward the both ends where the crossing width is 20λ.

The BAW resonators 77 and 78 preferably have the same electrode structure. However, in the IDT electrode at the center, the crossing width is 30λ at the center and becomes smaller toward the both ends where the crossing width is 12λ. λ is 1.6 μm, the width L of each electrode finger is 0.4 μm, the space width S between adjoining electrode fingers is 0.4 μm, and the gap width G, which is the width of the gap placed at the end of the electrode finger in the electrode finger length direction, is 0.3 μm.

For comparison, a BAW filter device including BAW filter devices and BAW resonators having the same structure except that the first and second protrusions are not provided was prepared as a third conventional example.

Figure 26:
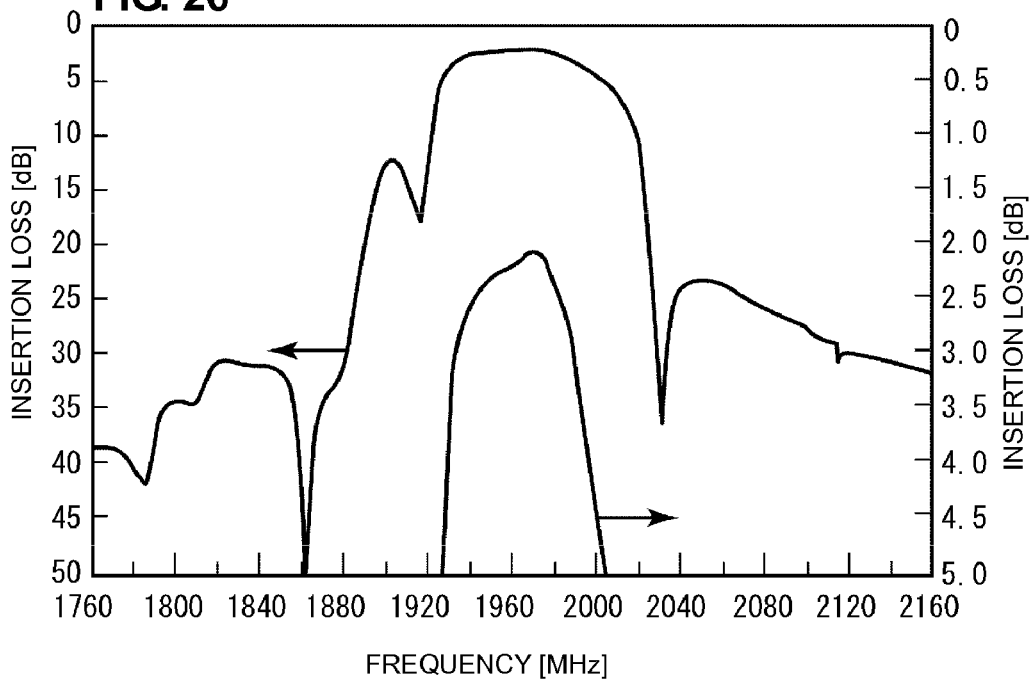
FIG. 26 illustrates an attenuation/frequency characteristic of the BAW filter device of the third preferred embodiment of the present invention.

The attenuation/frequency characteristic of the BAW device of the third preferred embodiment prepared in the above-described manner is illustrated in FIG. 26. The attenuation/frequency characteristic of the BAW device of the third conventional example prepared for comparison is illustrated in FIG. 27.

Figure 27:
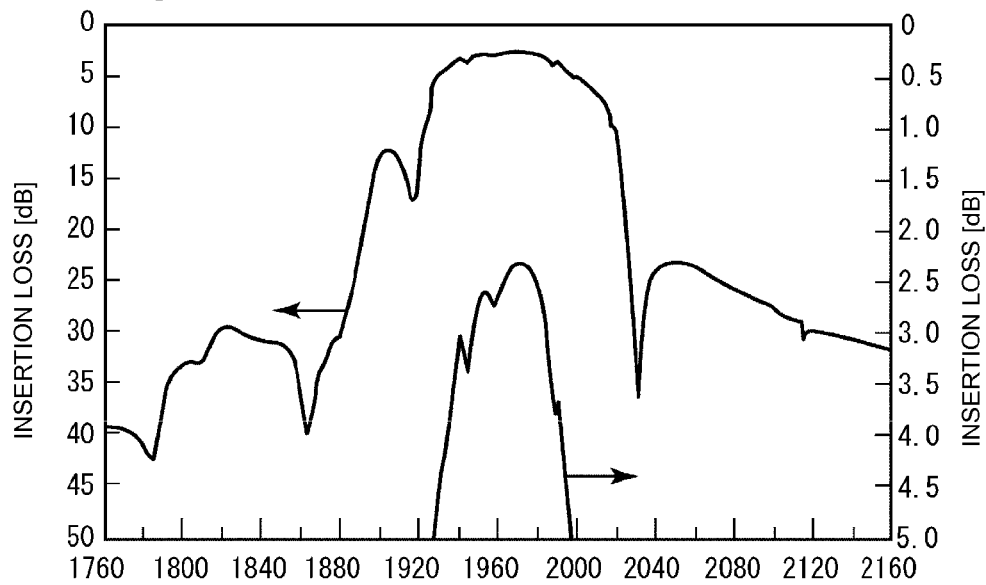
FIG. 27 illustrates an attenuation/frequency characteristic of a BAW filter device of the second conventional example.
Figure 28:
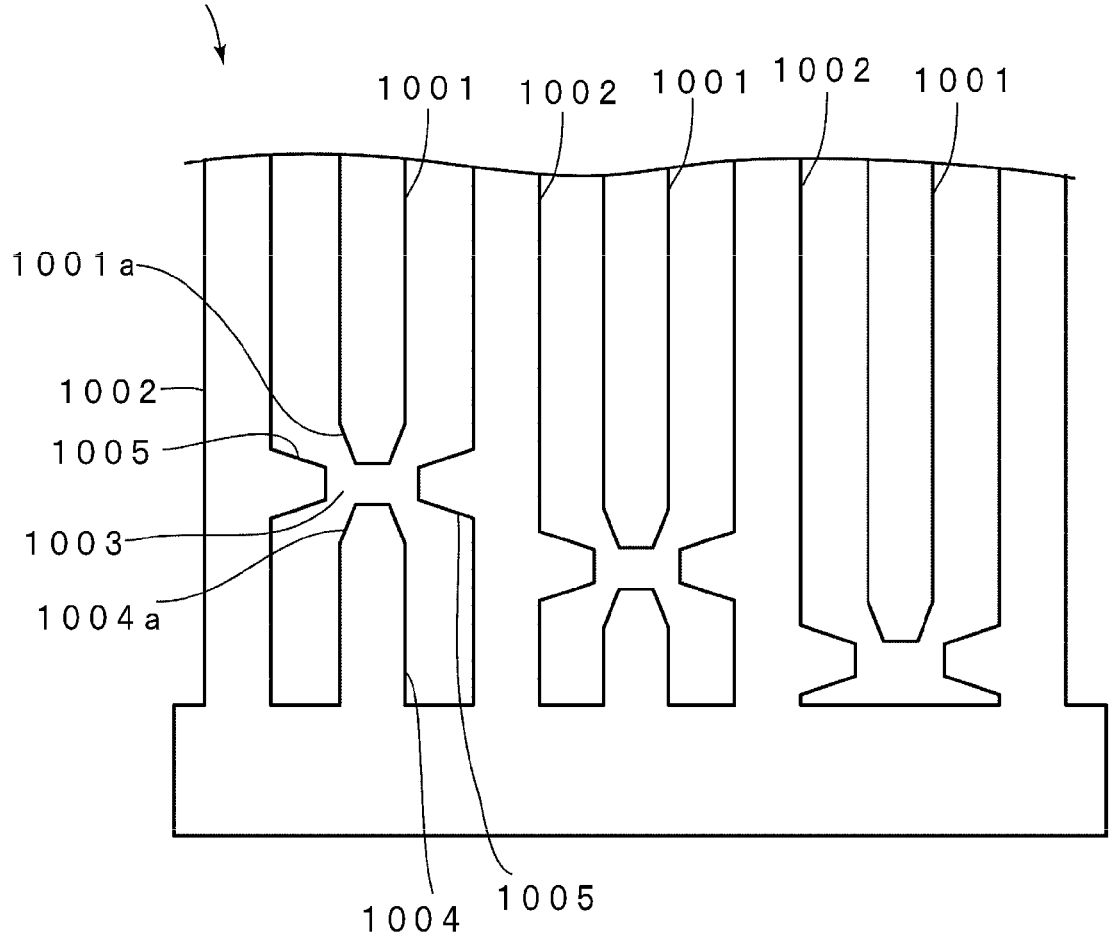
FIG. 28 is a partial plan view illustrating a main portion of an IDT electrode of an example of a conventional BAW filter device.

As is clear from comparison between FIGS. 26 and 27, it is apparent that, in the third preferred embodiment in which the first and second protrusions are provided, a minimum insertion loss in the passband can be decreased by about 0.2 dB, that the insertion loss can be reduced, and that the filter characteristics in the passband can be flattened.

When a BAW device is constituted by forming IDT electrodes on a piezoelectric substrate of $LiNbO_3$ or $LiTaO_3$ and by further laminating a $SiO_2$ film, an acoustic velocity ratio of boundary acoustic waves between the $SiO_2$ film and the IDT electrode is a cause of the above-described phase shift or diffraction. For this reason, an acoustic impedance ratio is a factor of scattering at the ends of electrode fingers. Thus, such a problem is more significant in a structure in which the acoustic velocity ratio or acoustic impedance is high. Therefore, in a preferred embodiment of the present invention where the first protrusions are provided or both the first and second protrusions are provided, the resonance characteristics and filter characteristics can be further improved. Normally, the acoustic velocity ratio and the acoustic impedance ratio are higher as the density ratio of the materials is higher. When an IDT electrode of Al is provided in a structure of $SiO_2$/IDT electrode/piezoelectric substrate, an advantageous effect of a preferred embodiment of the present invention can be obtained but the effect is relatively small. This is because the density ratio is small, that is, the density of $SiO_2$ is 2.2 g/cm$^3$ whereas the density of Al is 2.69 g/cm$^3$, and thus the density ratio is 2.69/2.2=1.22.

On the other hand, when Cu having a density of 8.93 g/cm$^3$ or Ag having a density of 19.3 g/cm$^3$ is used, the density ratio with respect to $SiO_2$ is high. Thus, the resonance characteristics and filter characteristics can be significantly improved as shown in the third preferred embodiment.

Therefore, in the present invention, the density ratio between at least one medium and the IDT electrode is preferably be higher than about 1.22.

As described above, the IDT electrode may include a plurality of laminated metal films or a single metal film. When the laminated metal films are used, a structure including an adhesion layer and a diffusion barrier layer of Ni, NiCr, or Ti is desirable. For example, a NiCr/Au/NiCr structure is desirable. Also, a structure including a laminate of Al and Au as a main electrode and a structure including the above-mentioned adhesion layer and barrier layer are effective. By using a high-density Au together with a low-density Al, the advantageous effects of preferred embodiments of the present invention are further enhanced.

The material of the medium to cover the IDT electrode is not limited to the above-described $SiO_2$, and another material such as SiN may be used. Alternatively, a laminate of a plurality of materials may be used, for example. For example, a laminated structure of SiN/$SiO_2$ or $SiO_2$/SiN/$SiO_2$ may be used, for example.

The SAW element has been described in the first preferred embodiment, but the present invention can be applied to a BAW element. Also, preferred embodiments of the present invention can be applied to a SAW device not including a medium to cover IDT electrodes.

The BAW element has been described in the second and third preferred embodiments, but a SAW element and a SAW filter device including the SAW element can also be applied.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An acoustic wave element comprising:
   a piezoelectric material; and
   at least one IDT electrode contacting the piezoelectric material and including a plurality of electrode fingers including first and second electrode fingers that are adjacent to each other in an acoustic wave propagation direction and that connect to different potentials and a first dummy electrode finger that faces the first electrode finger via a gap located on an outer side in an electrode finger length direction of an end of the first electrode finger and that connects to the same potential as the potential connected to the second electrode finger; wherein
   in an area of an IDT electrode crossing region in which the first and second electrode fingers that are adjacent to each other overlap each other in the acoustic wave propagation direction near the gap, a first protrusion is provided in at least one of the first electrode finger and the first dummy electrode finger, the first protrusion protruding in the acoustic wave propagation direction from at least one of side edges of the at least one of the first electrode finger and the first dummy electrode finger so as to define a protrusion portion of the at least one of the first electrode finger and the first dummy electrode finger that has a width in the acoustic wave propagation direction that is greater than a width of the first electrode finger; and
   the first protrusion is in contact with the gap.

2. The acoustic wave element according to claim 1, wherein a second protrusion protruding in the acoustic wave propagation direction is provided on a side edge of at least one of the first and second electrode fingers, the second protrusion being positioned in an area that includes the gap in the electrode finger length direction.

3. The acoustic wave element according to claim 2, wherein the second protrusion is arranged so that an effective propagation distance of surface waves propagating through the gap in a portion where the first and second electrode fingers are located and an effective propagation distance of acoustic waves propagating in a portion other than the gap and the first protrusion in the portion where the first and second electrode fingers are provided are substantially equal to each other.

4. The acoustic wave element according to claim 2, wherein the second protrusion protrudes from a side edge on the side facing the gap of one of the first and second electrode fingers toward the gap provided at an end of the other of the first and second electrode fingers.

5. The acoustic wave element according to claim 4, wherein the second protrusion is also provided in the other of the first and second electrode fingers.

6. The acoustic wave element according to claim 2, wherein the first and second protrusions have a trapezoid shape in plan view, a lower base of the trapezoid is a portion of a side edge of the at least one of the first electrode finger and the first dummy electrode finger provided with the first protrusion, and an inner angle defined by the lower base and a side edge connecting an upper base and the lower base of the trapezoid is less than about 90°.

7. The acoustic wave element according to claim 6, wherein a position in the electrode finger length direction of a midpoint of the lower base of the second protrusion is substantially equal to a center position in the electrode finger length direction of the gap at the end of the other of the first and second electrode fingers, a length of the lower base is larger than a gap width which is a dimension along the electrode finger length direction of the gap, and a length of the upper base is less than the gap width.

8. The acoustic wave element according to claim 6, wherein the first and second protrusions have an equiangular trapezoid shape in plan view.

9. The acoustic wave element according to claim 6, wherein the first and second protrusions have a plurality of rounded corner portions.

10. The acoustic wave element according to claim 1, wherein the piezoelectric material and the at least one IDT electrode are arranged to generate surface acoustic waves.

11. The acoustic wave element according to claim 10, further comprising a medium layer arranged to cover the at least one IDT electrode on the piezoelectric material, wherein a density of the at least one IDT electrode is equal to or higher than a density of the piezoelectric material and a density of the medium layer, and a ratio between the density of the at least one IDT electrode and the density of the medium layer is higher than about 1.22.

12. The acoustic wave element according to claim 1, wherein the piezoelectric material and the at least one IDT electrode are arranged to generate boundary acoustic waves.

13. The acoustic wave element according to claim 12, wherein a medium layer is laminated to cover the at least one IDT electrode on the piezoelectric material, a density of the at least one IDT electrode is equal to or higher than a density of the piezoelectric material and a density of the medium layer, and a ratio between the density of the at least one IDT electrode and a higher one of the density of the piezoelectric material and the density of the medium layer is higher than about 1.22.

14. The acoustic wave element according to claim 1, wherein crossing width weighting is applied to the at least one IDT electrode.

15. An acoustic wave element comprising:
a piezoelectric material; and
at least one IDT electrode contacting the piezoelectric material and including a plurality of electrode fingers including first and second electrode fingers that are adjacent to each other in an acoustic wave propagation direction and that connect to different potentials and a first dummy electrode finger that faces the first electrode finger via a gap located on an outer side in an electrode finger length direction of an end of the first electrode finger and that connects to the same potential as the potential connected to the second electrode finger; wherein
in an area of an IDT electrode crossing region in which the first and second electrode fingers that are adjacent to each other overlap each other in the acoustic wave propagation direction near the gap, a first protrusion is provided in at least one of the first electrode finger and the first dummy electrode finger, the first protrusion protruding in the acoustic wave propagation direction from at least one of side edges of the at least one of the first electrode finger and the first dummy electrode finger so as to define a protrusion portion of the at least one of the first electrode finger and the first dummy electrode finger that has a width in the acoustic wave propagation direction that is greater than a width of the first electrode finger; and
the first protrusion is separated from the gap, and a tapered portion is provided between the first protrusion and the gap, a width of the at least one of the first electrode finger and the first dummy electrode finger provided with the first protrusion being smaller at an end in the tapered portion.

16. The acoustic wave element according to claim 15, wherein a side edge portion of the at least one of the first electrode finger and the first dummy electrode finger extending from the first protrusion to the tapered portion has a concave shape.

17. The acoustic wave element according to claim 15, wherein a side edge portion of the at least one of the first electrode finger and the first dummy electrode finger extending from the first protrusion to the tapered portion has a convex shape.

\* \* \* \* \*